(12) United States Patent
Wu et al.

(10) Patent No.: US 12,249,587 B2
(45) Date of Patent: Mar. 11, 2025

(54) SEMICONDUCTOR STRUCTURE AND FORMING METHOD THEREOF

(71) Applicant: Taiwan Semiconductor Manufacturing Company, Ltd., Hsinchu (TW)

(72) Inventors: Jiun-Yi Wu, Taoyuan (TW); Chen-Hua Yu, Hsinchu (TW); Yu-Min Liang, Taoyuan (TW); Jung-Wei Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 525 days.

(21) Appl. No.: 17/672,729

(22) Filed: Feb. 16, 2022

(65) Prior Publication Data
US 2023/0260945 A1    Aug. 17, 2023

(51) Int. Cl.
  *H01L 23/48*      (2006.01)
  *H01L 21/56*      (2006.01)
  *H01L 23/00*      (2006.01)
  *H01L 23/498*     (2006.01)
  *H01L 25/00*      (2006.01)
  (Continued)

(52) U.S. Cl.
  CPC ............ *H01L 24/20* (2013.01); *H01L 21/565* (2013.01); *H01L 23/481* (2013.01); *H01L 23/49822* (2013.01); *H01L 24/19* (2013.01); *H01L 24/24* (2013.01); *H01L 24/27* (2013.01); *H01L 24/32* (2013.01); *H01L 24/73* (2013.01); *H01L 25/0655* (2013.01); *H01L 25/105* (2013.01); *H01L 25/50* (2013.01); *H01L 2224/221* (2013.01); *H01L 2224/24225* (2013.01); *H01L 2224/2783* (2013.01); *H01L 2224/32057* (2013.01); *H01L 2224/32225* (2013.01);
  (Continued)

(58) Field of Classification Search
  CPC ............... H01L 23/49822; H01L 24/20; H01L 25/0655; H01L 25/0657; H01L 2225/1058
  USPC .................................................. 257/686, 758
  See application file for complete search history.

(56) References Cited

U.S. PATENT DOCUMENTS 8,993,380 B2   3/2015  Hou et al.
9,281,254 B2   3/2016  Yu et al.
(Continued)

*Primary Examiner* — Nitin Parekh
(74) *Attorney, Agent, or Firm* — JCIPRNET

(57) ABSTRACT

A semiconductor structure includes a substrate component, an IC die component over the substrate component, and a composite redistribution structure interposed between and electrically coupled to the substrate and IC die components. The composite redistribution structure includes a local interconnect component between a first redistribution structure overlying the substrate component and a second redistribution structure underlying the IC die component, and an insulating encapsulation between the first and second redistribution structures and embedding the local interconnect component therein. The local interconnect component includes TSVs penetrating through a substrate and electrically coupled to first and second conductive connectors, the first conductive connectors between the first redistribution structure and a first side of the substrate, the second conductive connectors between the second redistribution structure and a second side of the substrate, and a first insulating layer between the first redistribution structure and the first side and laterally covering the first conductive connectors.

20 Claims, 29 Drawing Sheets

(51) Int. Cl.
  *H01L 25/065* (2023.01)
  *H01L 25/10* (2006.01)
(52) U.S. Cl.
  CPC ............... *H01L 2224/73267* (2013.01); *H01L 2225/1058* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,398,422 B2 * | 7/2022 | Lu ........................... H01L 25/03 |
| 2014/0360767 A1 * | 12/2014 | Terui ....................... H01L 24/19 |
| | | 174/261 |
| 2016/0329272 A1 * | 11/2016 | Geissler ............. H01L 23/49827 |
| 2020/0135649 A1 * | 4/2020 | Chang ................ H01L 21/6836 |
| 2020/0176346 A1 * | 6/2020 | Wu ...................... H01L 23/3135 |
| 2020/0388600 A1 * | 12/2020 | Huang ................ H01L 23/5226 |
| 2021/0272929 A1 * | 9/2021 | Tsai .................... H01L 23/5383 |
| 2021/0391272 A1 * | 12/2021 | Tsai .................... H01L 23/5389 |
| 2022/0165675 A1 * | 5/2022 | Huang ................ H01L 23/3121 |
| 2022/0359408 A1 * | 11/2022 | Tsai ........................ H01L 24/20 |

* cited by examiner

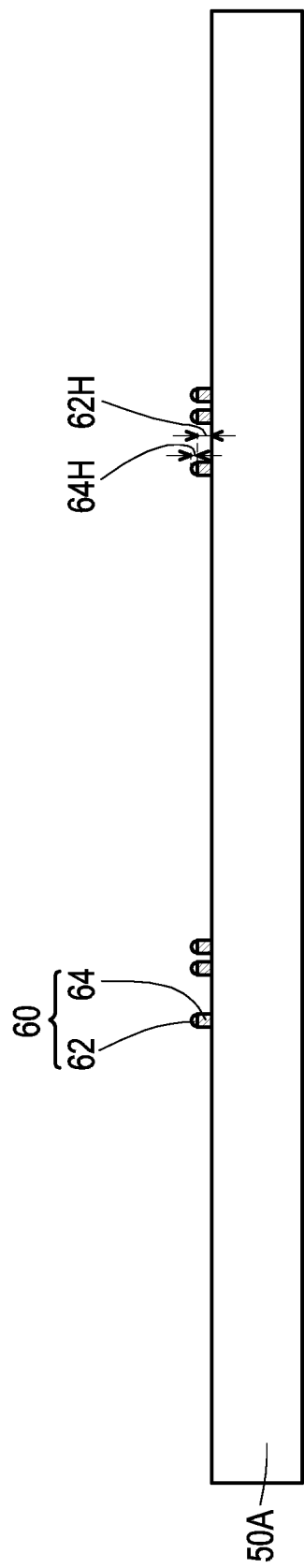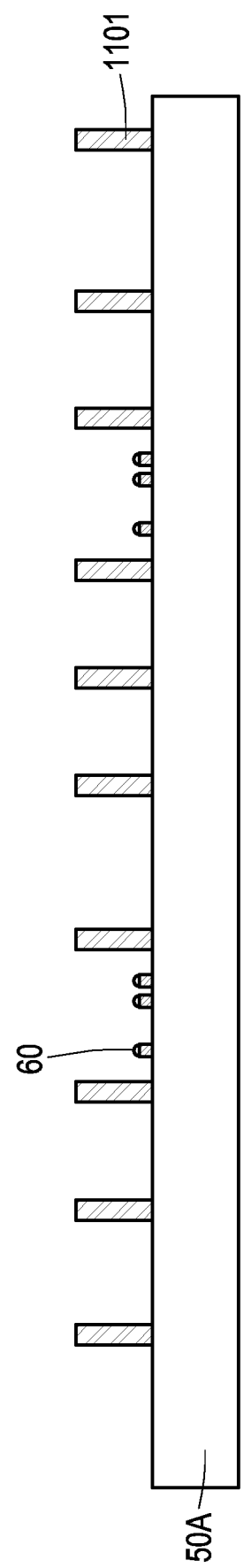

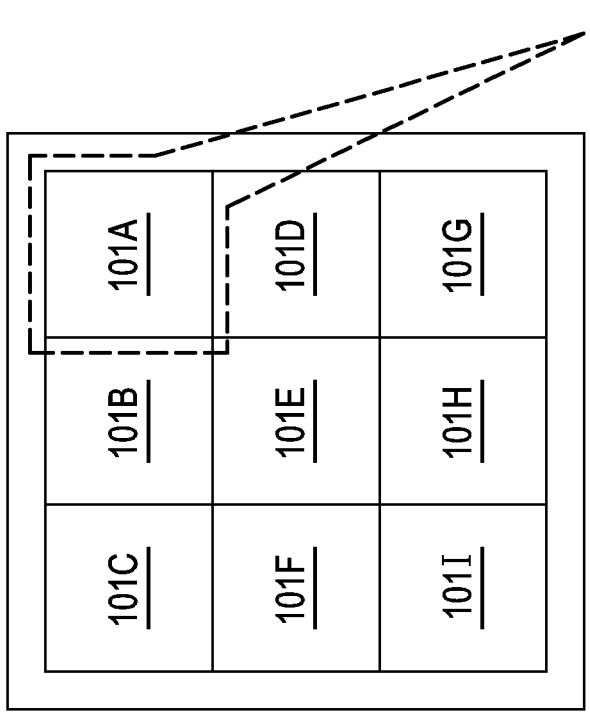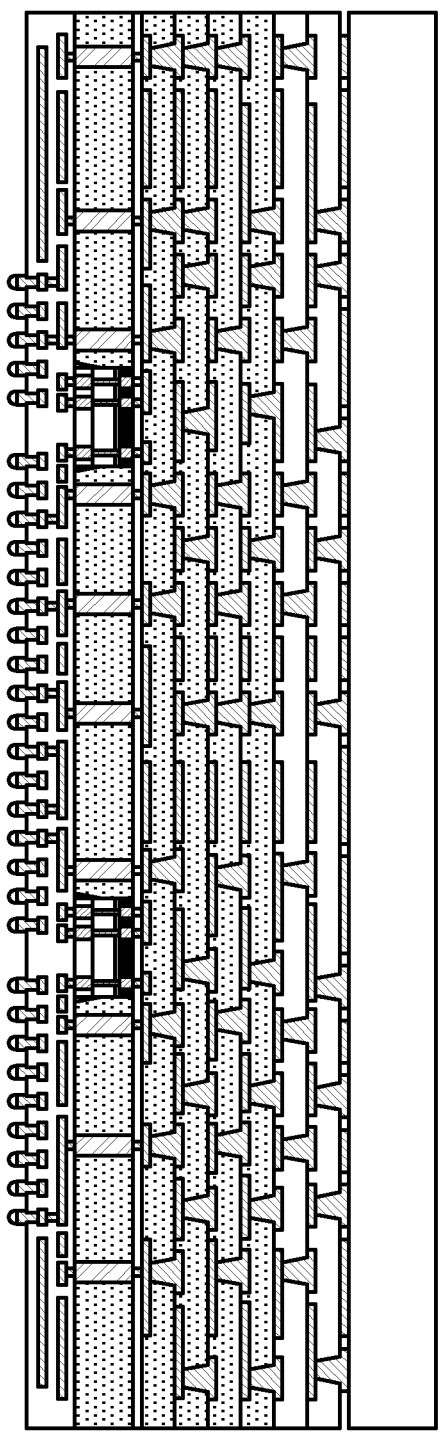
FIG. 3B

SEMICONDUCTOR STRUCTURE AND FORMING METHOD THEREOF

BACKGROUND

Contemporary high performance computing systems consisting of one or more electronic devices have become widely used in a variety of advanced electronic applications. When integrated circuit components or semiconductor chips are packaged for these applications, one or more chip packages are generally bonded to a circuit carrier (e.g., a system board, a printed circuit board, or the like) for electrical connections to other external devices or electronic components. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a schematic planar view of the layout of package regions on a panel substrate in accordance with some embodiments.

DETAILED DESCRIPTION

Figure 1A:
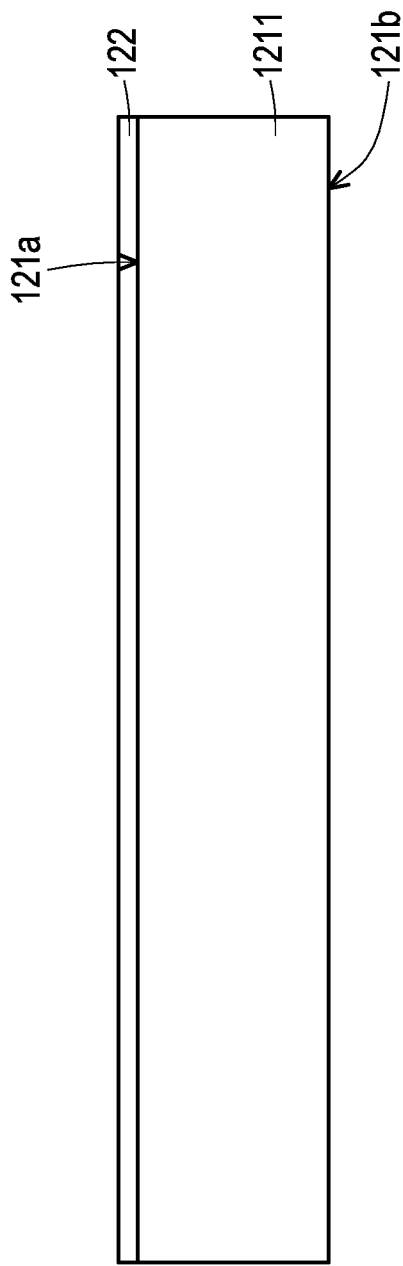
FIGS. 1A-1H are schematic cross-sectional views of structures produced at various stages of a manufacturing method of a local interconnect component according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1H are schematic cross-sectional views of structures produced at various stages of a manufacturing method of a local interconnect component according to some embodiments. Referring to FIG. 1A, an interconnect structure 122 is formed over a semiconductor substrate 1211 through back-end-of-line (BEOL) processes. The semiconductor substrate 1211 may include a first surface 121$a$ and a second surface 121$b$ opposite to each other, and the interconnect structure 122 may be formed on the first surface 121$a$. The semiconductor substrate 1211 includes silicon and may be referred to as a silicon substrate. The semiconductor substrate 1211 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In some embodiments, the semiconductor substrate 1211 is a semiconductor-on-insulator (SOI) substrate. The semiconductor substrate 1211 may alternatively be a glass substrate, a ceramic substrate, a polymer substrate, or any other substrate that may provide a suitable protection and/or interconnection functionality.

In some embodiments, the semiconductor substrate 1211 is free from both active and passive devices therein. For example, the interconnect structure 122 is directly formed on the first surface 121$a$ of the semiconductor substrate 1211. The interconnect structure 122 may include inter-level dielectrics, inter-metal dielectrics, metallization layers (e.g., vias, lines, and pads; not individually shown), etc. The interconnect structure 122 may be formed by forming metallization layers in dielectric materials using a damascene process or any suitable technique. In some embodiments, device elements (not shown) are formed at the first surface 121a on/in the semiconductor substrate 1211 through a front-end-of-line (FEOL) process. Following the FEOL process is the BEOL process, where the device elements are covered by the dielectric layer of the interconnect structure 122 and are interconnected with the metallization layers in the interconnect structure 122. The device elements may include active devices (e.g., transistors, diodes, etc.), passive devices (e.g., resistors, capacitors, inductors, etc.), and/or any suitable electrical devices designed to achieve specific functions.

Figure 1B:
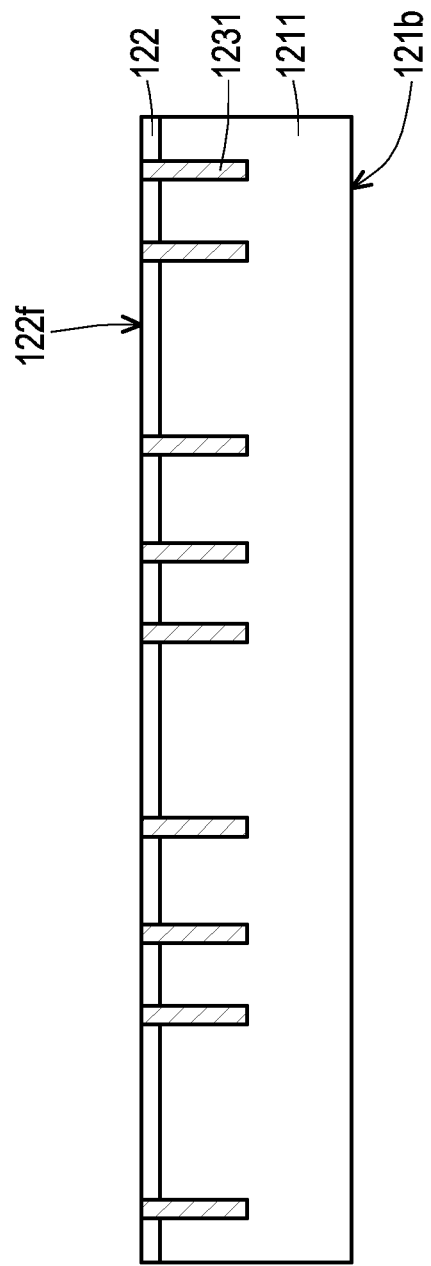

Referring to FIG. 1B, a plurality of conductive pillars 1231 may be formed through the interconnect structure 122 and may extend into the semiconductor substrate 11211. For example, the respective conductive pillar 1231 extends from the first surface 121a of the semiconductor substrate 1211 toward, but do not reach, the second surface 121b of the semiconductor substrate 1211. The conductive pillars 1231 may be formed by forming a hole in the interconnect structure 122 and the semiconductor substrate 1211 and forming one or more diffusion barrier layer(s) or isolation layer(s), depositing a seed layer, and depositing a conductive material (e.g., tungsten, titanium, aluminum, copper, alloy, any combinations thereof and/or the like) in the hole. In some embodiments, excess materials formed on the first surface 122f of the interconnect structure 122 are removed using a planarization process, and the first surface 122f of the interconnect structure 122 may be substantially leveled with the upper surfaces of the conductive pillars 1231.

Figure 1C:
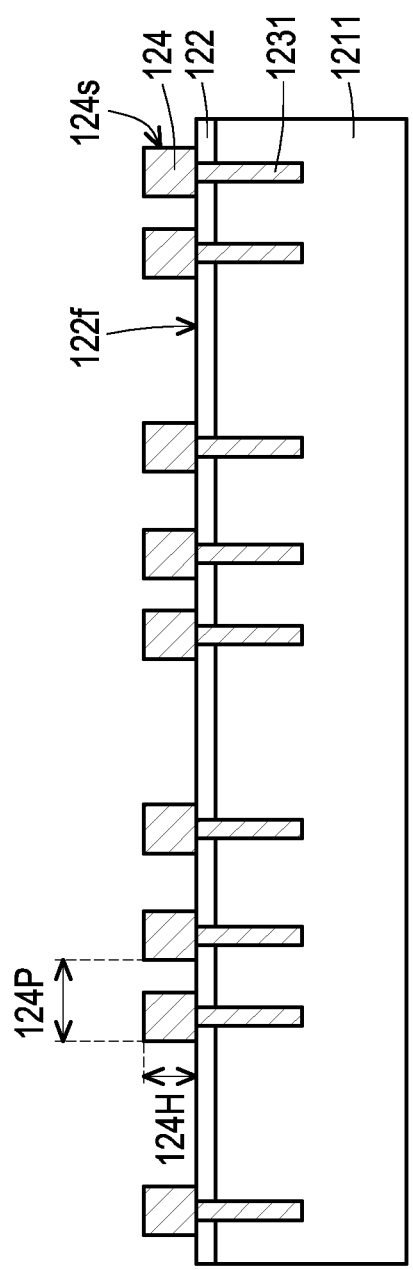

Referring to FIG. 1C, a plurality of first conductive connectors 124 may be formed on the first surface 122f of the interconnect structure 122 through plating or any suitable deposition process. The material of the first conductive connectors 124 may include a metal, like copper, titanium, tungsten, aluminum, alloy, and/or the like. The first conductive connectors 124 may be electrically coupled to the metallization layers (not shown) in the interconnect structure 122 and may be electrically coupled to the conductive pillars 1231. For example, the sidewall of the respective first conductive connector 124 is substantially vertical. In some embodiments, the critical dimensions of the first conductive connectors 124 may be between about 5 μm to about 50 μm. In some embodiments, the pitch 124P of two adjacent first conductive connectors 124 ranges from about 20 μm to about 80 μm. The height 124H of the respective first conductive connector 124 may range from about 2 μm to about 30 μm. It should be understood that minimum feature sizes for different technology nodes will have different critical dimensions, pitches, and heights.

Figure 1D:
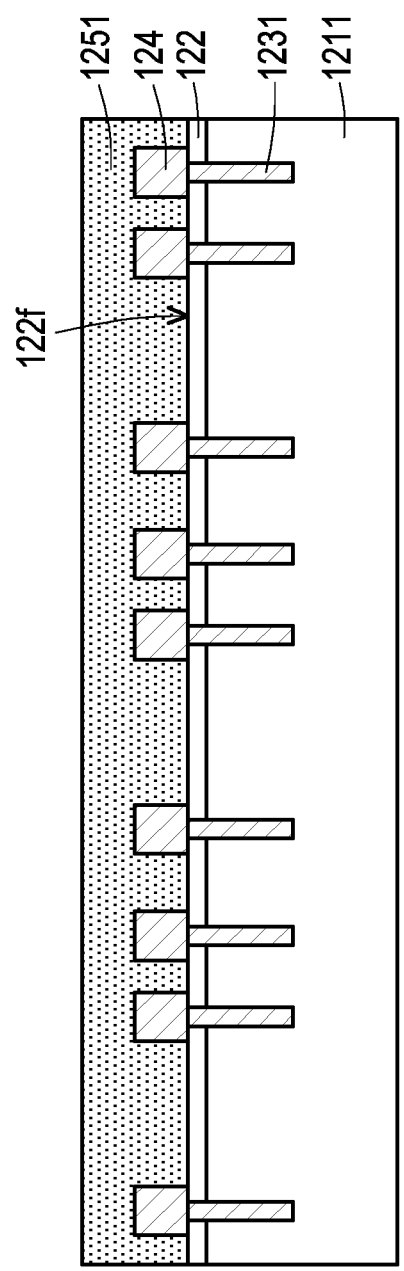

Referring to FIG. 1D, a first insulating material layer 1251 may be formed on the interconnect structure 122. In some embodiments, the first insulating material layer 1251 is a molding layer. For example, a molding compound material is applied on the first surface 122f of the interconnect structure 122 to cover the first conductive connectors 124, and then a thermal process is applied to harden the molding compound material and to transform it into the first insulating material layer 1251. The molding compound material may include fillers, such as silica, or other applicable materials, to increase its strength. Depending on warpage analysis, the first insulating material layer 1251 may include any suitable insulating material (e.g., an epoxy, a polyimide, a polybenzoxazole (PBO), a benzocyclobutene (BCB), a resin, a resist, a tape, a resist, an oxide or nitride, and/or the like) and may be formed by any suitable deposition process.

Figure 1E:
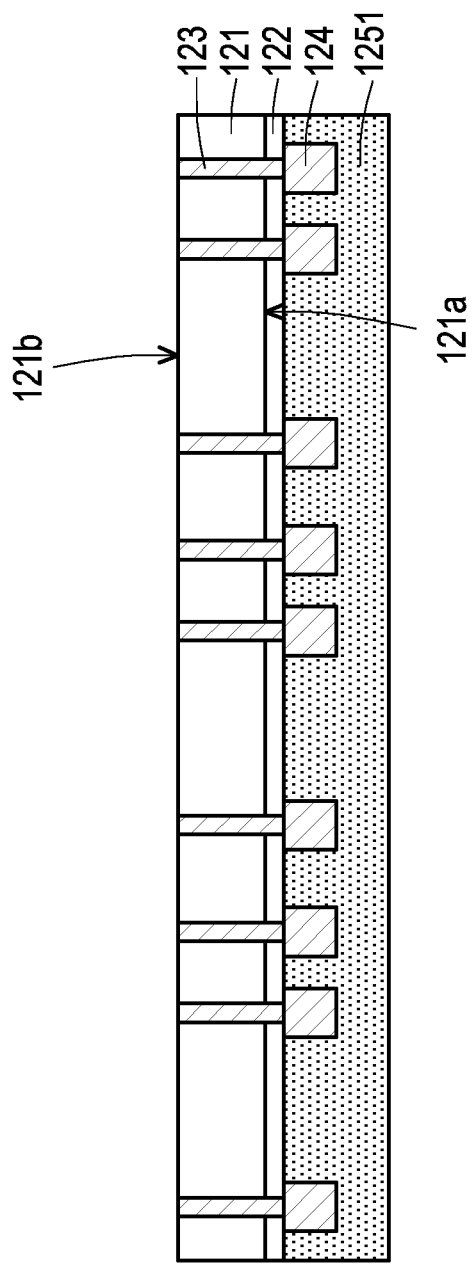

Referring to FIG. 1E and with reference to FIG. 1D, a thinning process (e.g., grinding, chemical-mechanical polishing (CMP), etching, a combination thereof, and/or another process) may be applied to the second surface 121b of the semiconductor substrate 1211 to form the semiconductor substrate 121. For example, the structure shown in FIG. 1D may be turned upside down to perform the thinning process on the second surface 121b. At least a portion of the respective conductive pillar 1231 may be accessibly revealed by the semiconductor substrate 121 during the thinning process. In some embodiments, the conductive pillars 1231 are slightly removed during the thinning process. After the thinning process, the respective conductive pillar 1231 may penetrate through the semiconductor substrate 121, and thus the conductive pillars 1231 may be referred to as through substrate vias (TSVs) 123. An isolation layer (not shown) is optionally formed on the second surface 121b of the semiconductor substrate 121 to laterally cover a portion of the respective TSV 123 that is protruded from the second surface 121b of the semiconductor substrate 121.

Figure 1F:
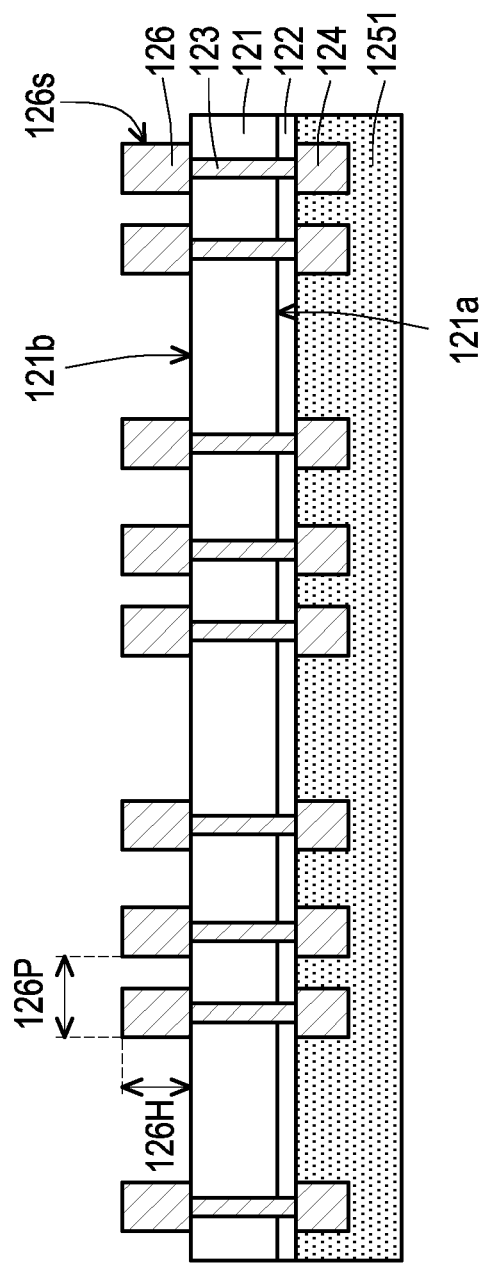

Referring to FIG. 1F, a plurality of second conductive connectors 126 may be formed on the second surface 121b of the semiconductor substrate 121 to be electrically coupled to the TSVs 123. The forming process and the material of the second conductive connectors 126 may be similar to those of the first conductive connectors 124. For example, the sidewall 126s of the respective second conductive connector 126 is substantially vertical. In some embodiments, the critical dimensions of the second conductive connectors 126 may be between about 5 μm to about 50 μm. In some embodiments, the pitch 126P of two adjacent second conductive connectors 126 ranges from about 20 μm to about 80 μm. The height 124H of the respective first conductive connector 124 may range from about 2 μm to about 30 μm. In some embodiments, the height of the second conductive connectors 126 is greater than that of the first conductive connectors 124. In alternative embodiments, the height of the second conductive connectors 126 is substantially equal to (or less than) that of the first conductive connectors 124. Depending on the product and design requirements, the critical dimensions, the pitches, and the heights of the second conductive connectors 126 may vary.

Figure 1G:
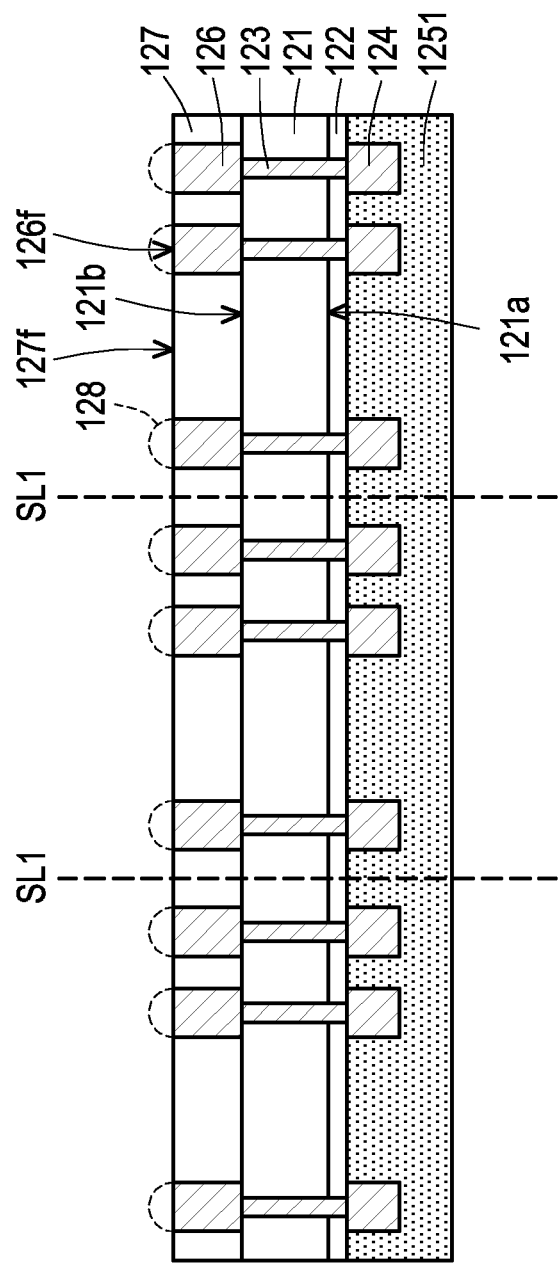

Referring to FIG. 1G, a second insulating layer 127 may be formed on the second surface 121b of the semiconductor substrate 121 to laterally cover the second conductive connectors 126. In alternative embodiments, the second insulating layer is omitted (see FIG. 6). The material of the second insulating layer 127 includes a polymer layer (e.g., PBO, polyimide, BCB, or the like), a nitride (e.g., silicon nitride or the like), an oxide (e.g., silicon oxide, borosilicate glass (BSG), or the like), the like, or a combination thereof. The second insulating layer 127 may be a single layer or include more than one sublayer. In some embodiments, the first insulating material layer 1251 and the second insulating layer 127 are of different materials. For example, the first insulating material layer 1251 is a molding layer formed by a molding process, and the second insulating layer 127 is a polymer layer formed by a coating process. The material of the first insulating material layer 1251 may be more rigid than that of the second insulating layer 127. In some embodiments, the first insulating material layer 1251 includes fillers, and the second insulating layer 127 is filler-free. It should be noted that depending on warpage analysis, the second insulating layer 127 may include any suitable insulating material to counter the tensile stress induced by mismatch of coefficient of thermal expansion (CTE).

A planarization process is optionally performed to substantially level the first surface 127f of the second insulating layer 127 and the first surfaces 126f of the second conductive connectors 126. In alternative embodiments, the second insulating layer with openings is first formed on the second surface 121b of the semiconductor substrate 121, and then the second conductive connectors are formed in the openings of the second insulating layer. Under this scenario, the second conductive connectors may have tilted sidewalls and may be tapered toward the semiconductor substrate 121. In some embodiments, a solder material is formed on the first surface 126f of the respective second conductive connector 126, and then a reflow process is performed on the solder material to form a cap portion 128 with a desired bump shape. It should be noted that the cap portion 128 on the respective second conductive connector 126 may be omitted, and thus the cap portions 128 are shown in phantom to indicate that they may or may not exist.

Figure 1H:
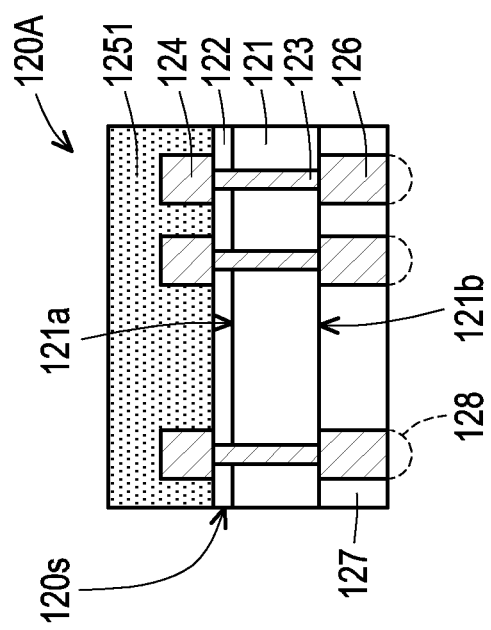

Referring to FIG. 1H and with reference to FIG. 1G, the aforementioned processes may be performed in a wafer level, and a singulation process may be performed along scribe lines SL1 to form a plurality of local interconnect components 120A, in accordance with some embodiments. For example, the second insulating layer 127, the semiconductor substrate 121 underlying the second insulating layer 127, the interconnect structure 122 underlying the semiconductor substrate 121, and the first insulating material layer 125I underlying the interconnect structure 122 are cut through to form a conterminous sidewall 120s of the local interconnect component 120A. The area in a plan view of the local interconnect component 120A may be in a range from about 2 mm x about 3 mm to about 50 mm x about 80 mm. In some embodiments, a chip probe (CP) testing may be performed on the local interconnect component 120A through the cap portions 128 to ascertain whether the local interconnect component 120A is a known good die (KGD). Only KGDs undergo subsequent processing are packaged, and other dies, which fail the CP testing, are not packaged. The cap portions 128 may (or may not) be removed after CP testing.

In some embodiments, the local interconnect component 120A is free of active or passive devices and may only be used for routing of electrical signals. In the embodiments where the local interconnect component 120A is a functional die, the device elements (not shown) are formed at the first surface 121a of the semiconductor substrate 121 and covered by the interconnect structure 122, and the interconnect structure 122 interconnects the device elements and/or provides electrical routing and connection between the first conductive connectors 124 and/or the second conductive connectors 126. The first conductive connectors 124 on the interconnect structure 122 over the first surface 121a (also called a front side) of the semiconductor substrate 121 may be embedded in the first insulating material layer 125I for protection at this stage, while the second conductive connectors 126 (or the cap portions, if exist) on the second surface 121b (also called a back side) of the semiconductor substrate 121 may be accessibly revealed by the second insulating layer 127 for the further electrical connection. The local interconnect component 120A includes the TSVs 123 to electrically connect the first conductive connectors 124 and the second conductive connectors 126 at two opposing sides of the semiconductor substrate 121. The TSVs 123 may provide the ability to electrically couple this local interconnect component to adjacent devices (e.g., devices above and below this local interconnect component) as will described later in other embodiments.

Figure 2C:
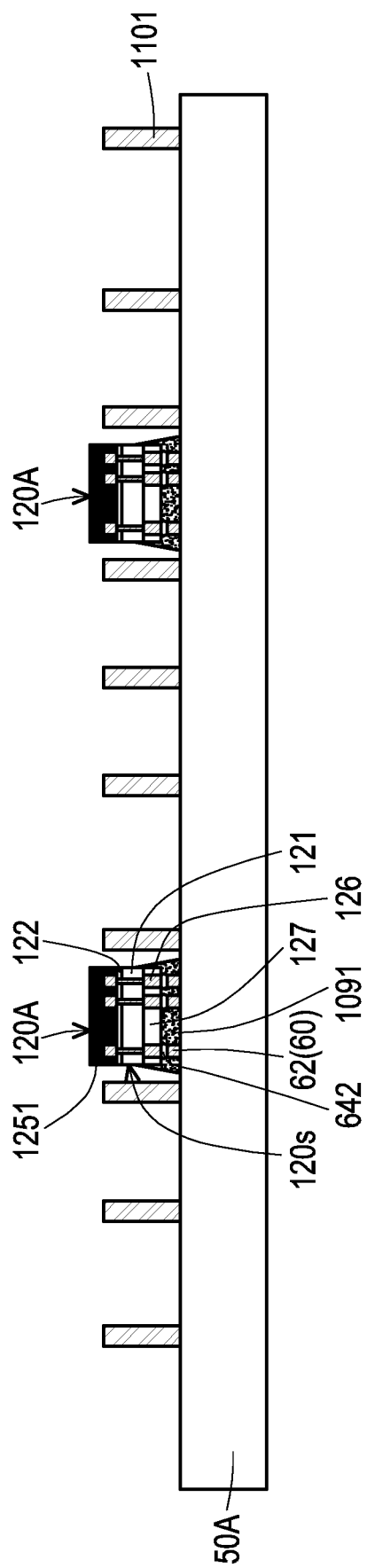
FIGS. 2A-2N are schematic cross-sectional views of structures produced at various stages of a manufacturing method of a semiconductor package according to some embodiments.
Figure 2D:
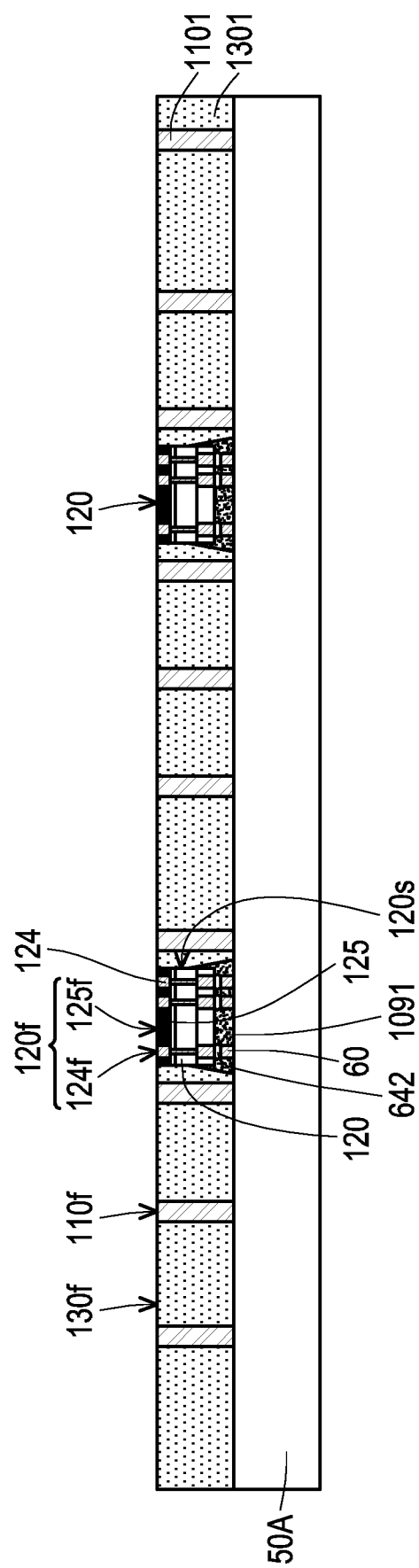
Figure 2E:
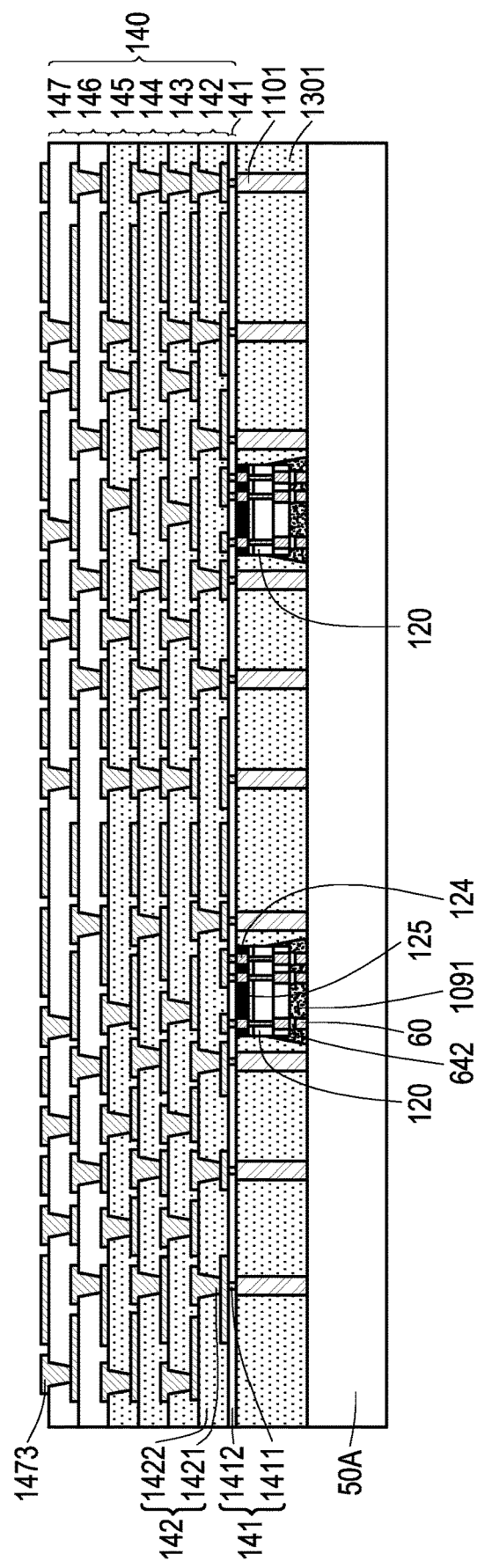
Figure 2F:
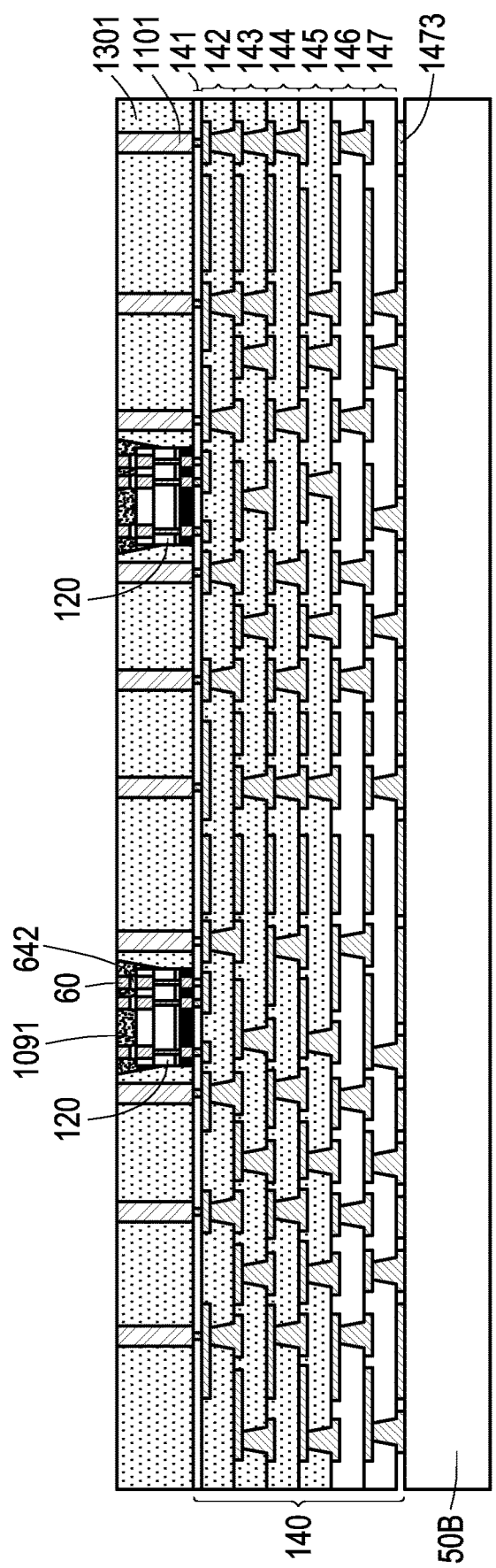
Figure 2G:
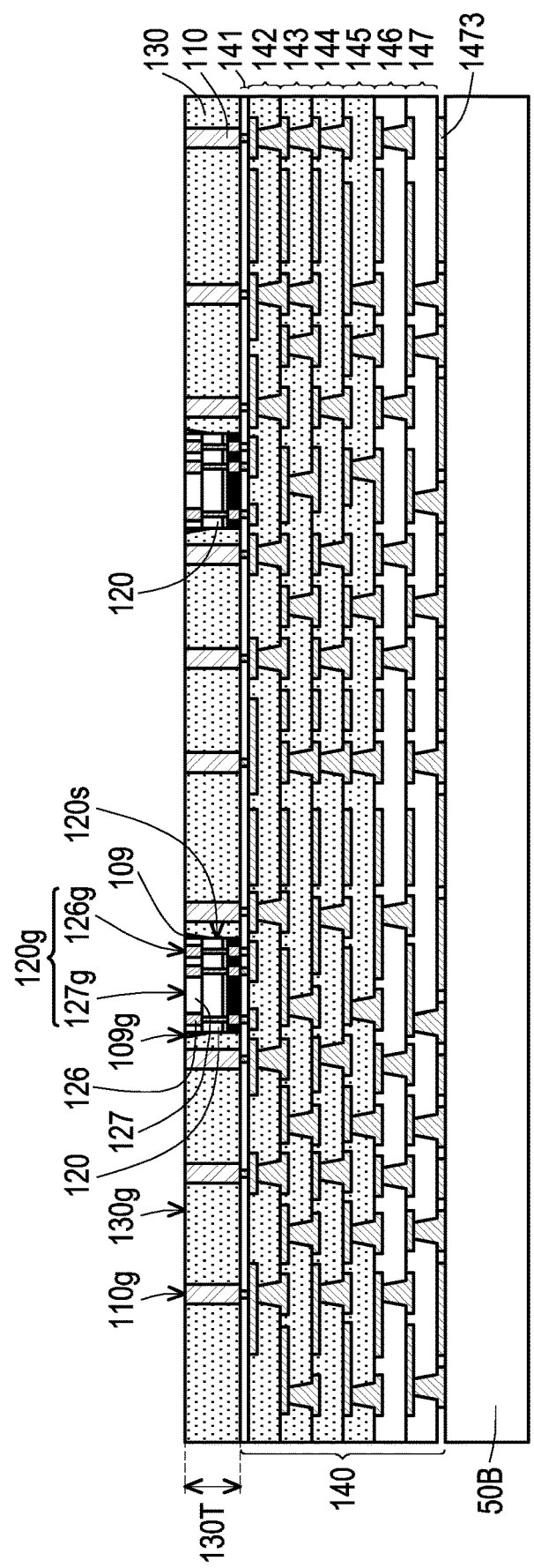
Figure 2H:
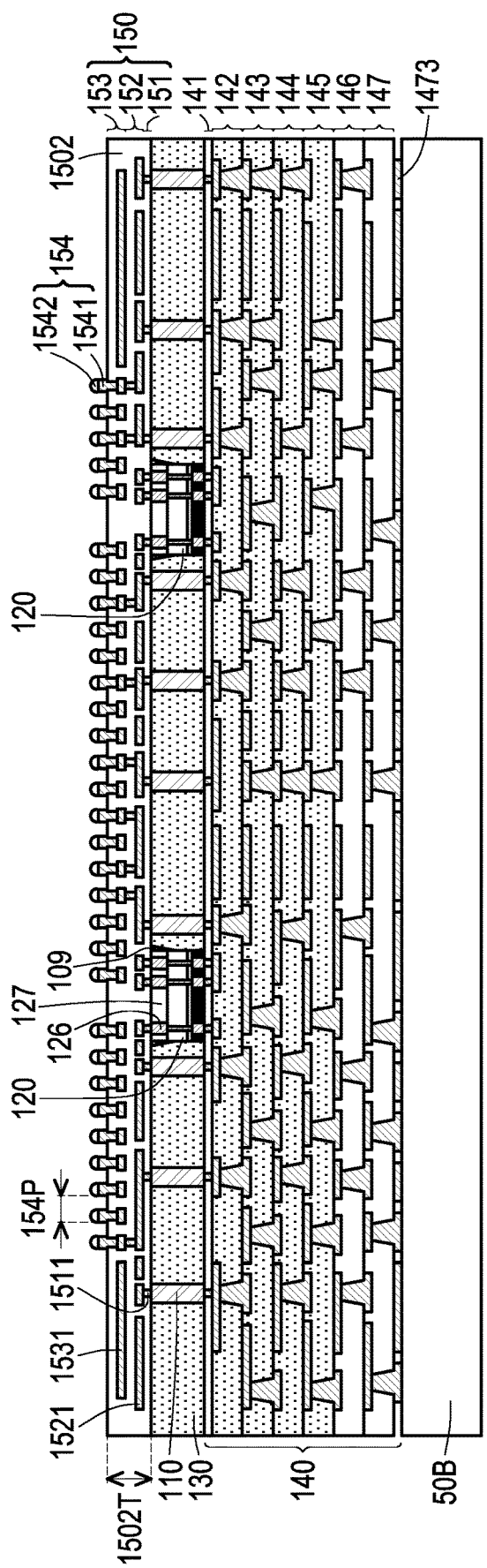
Figure 21:
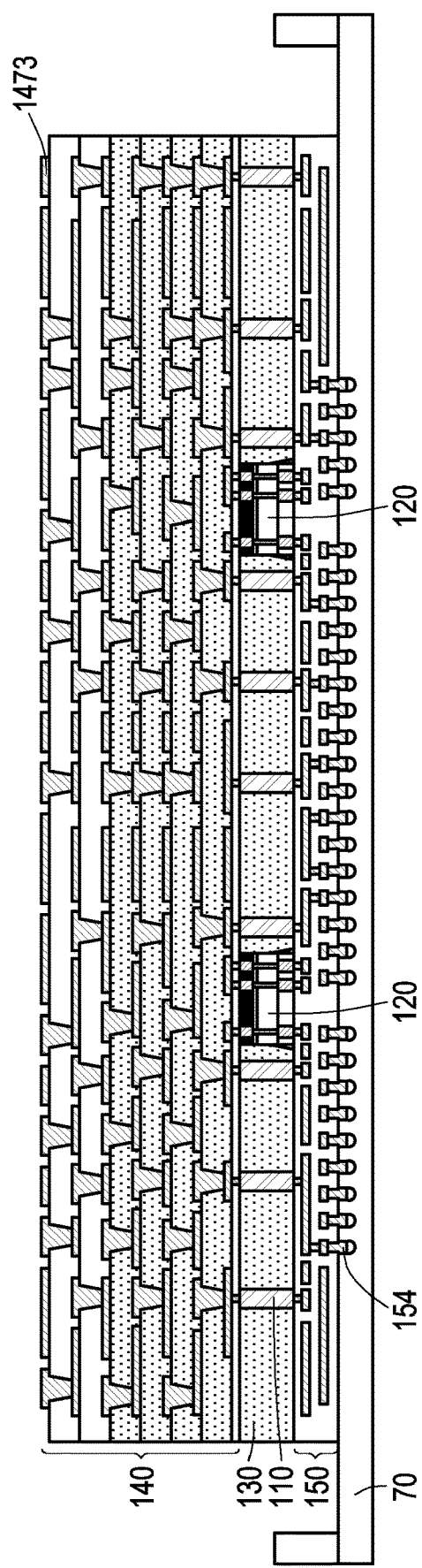
Figure 2J:
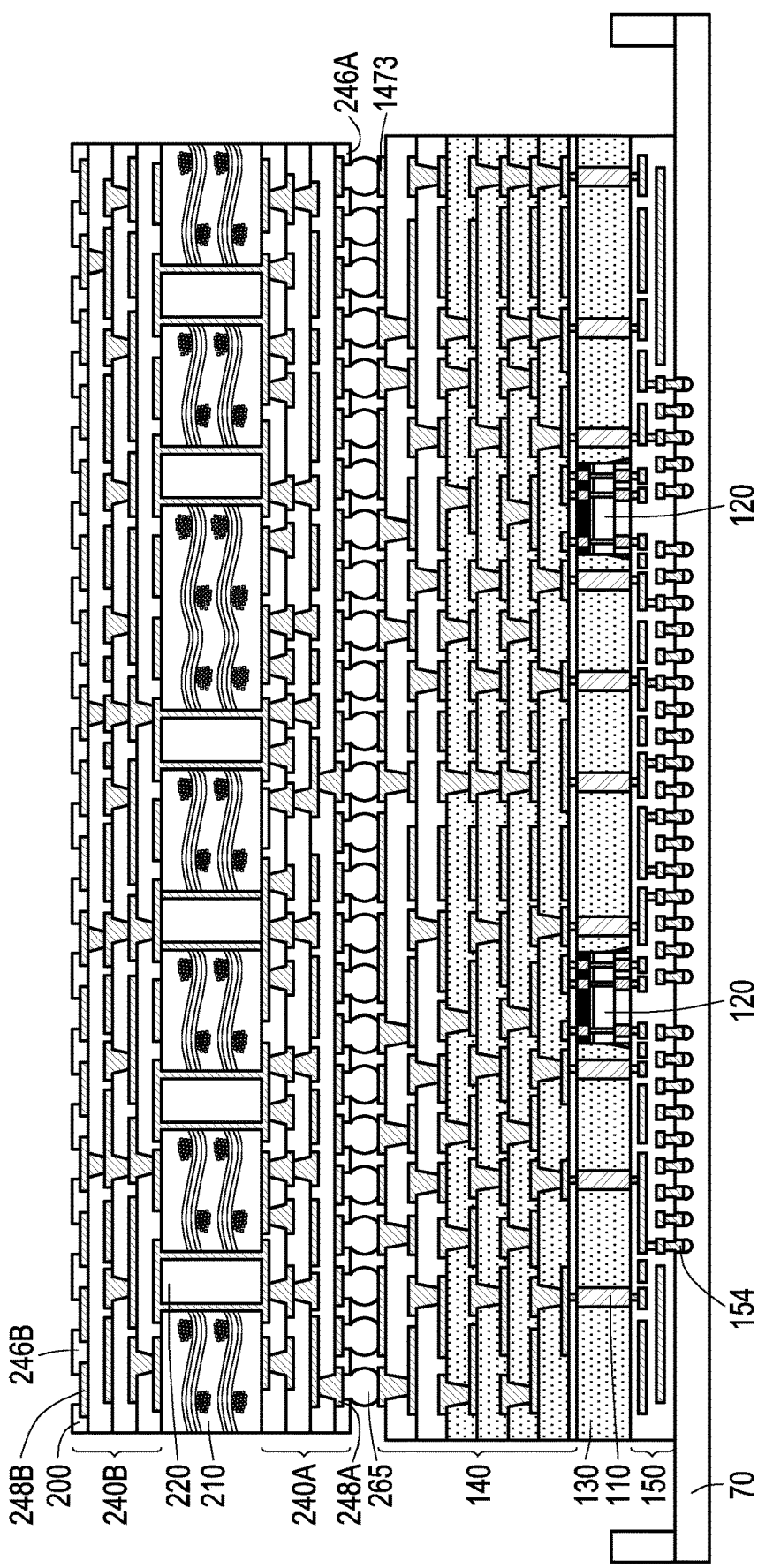
Figure 2K:
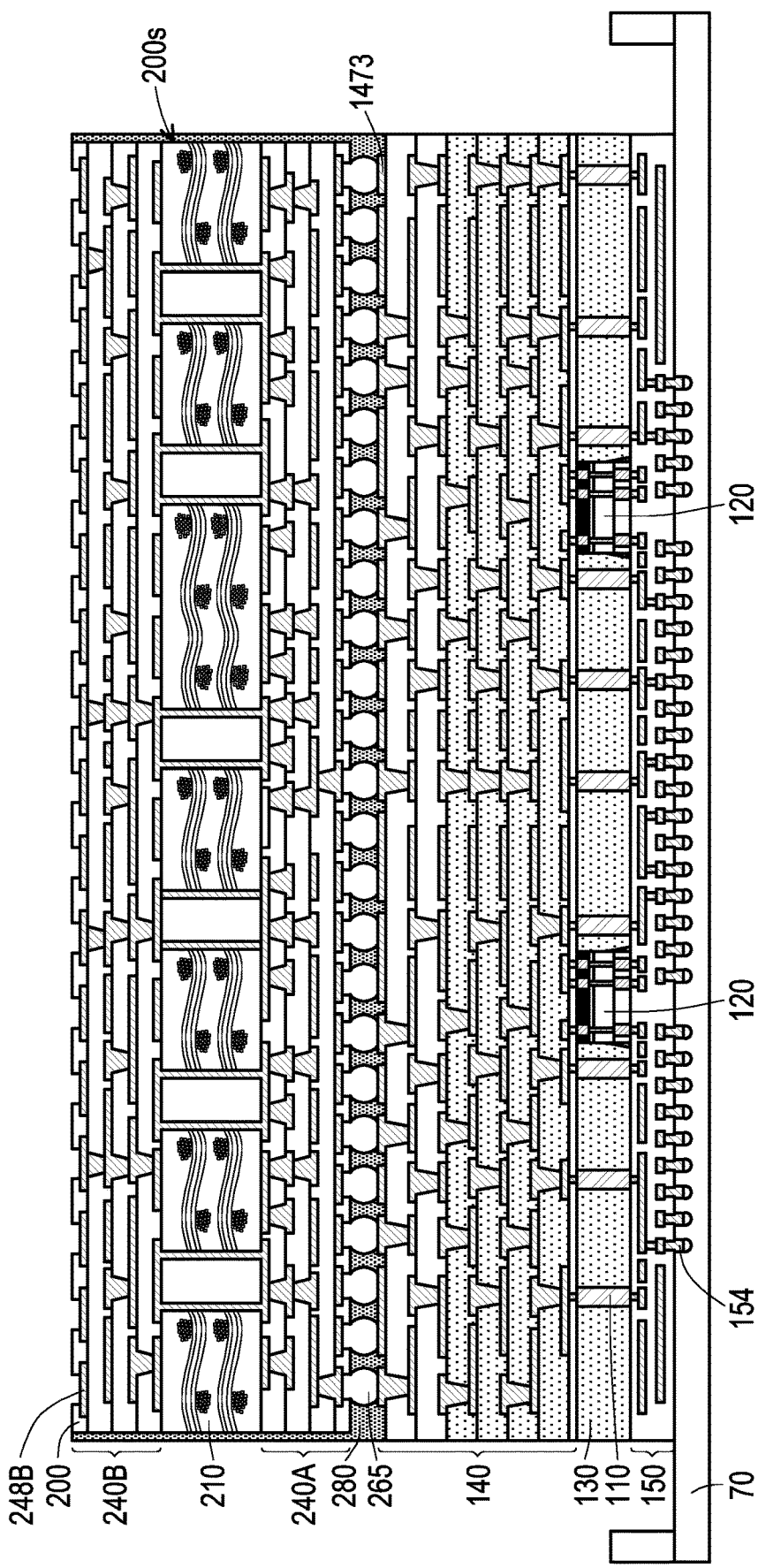
Figure 2L:
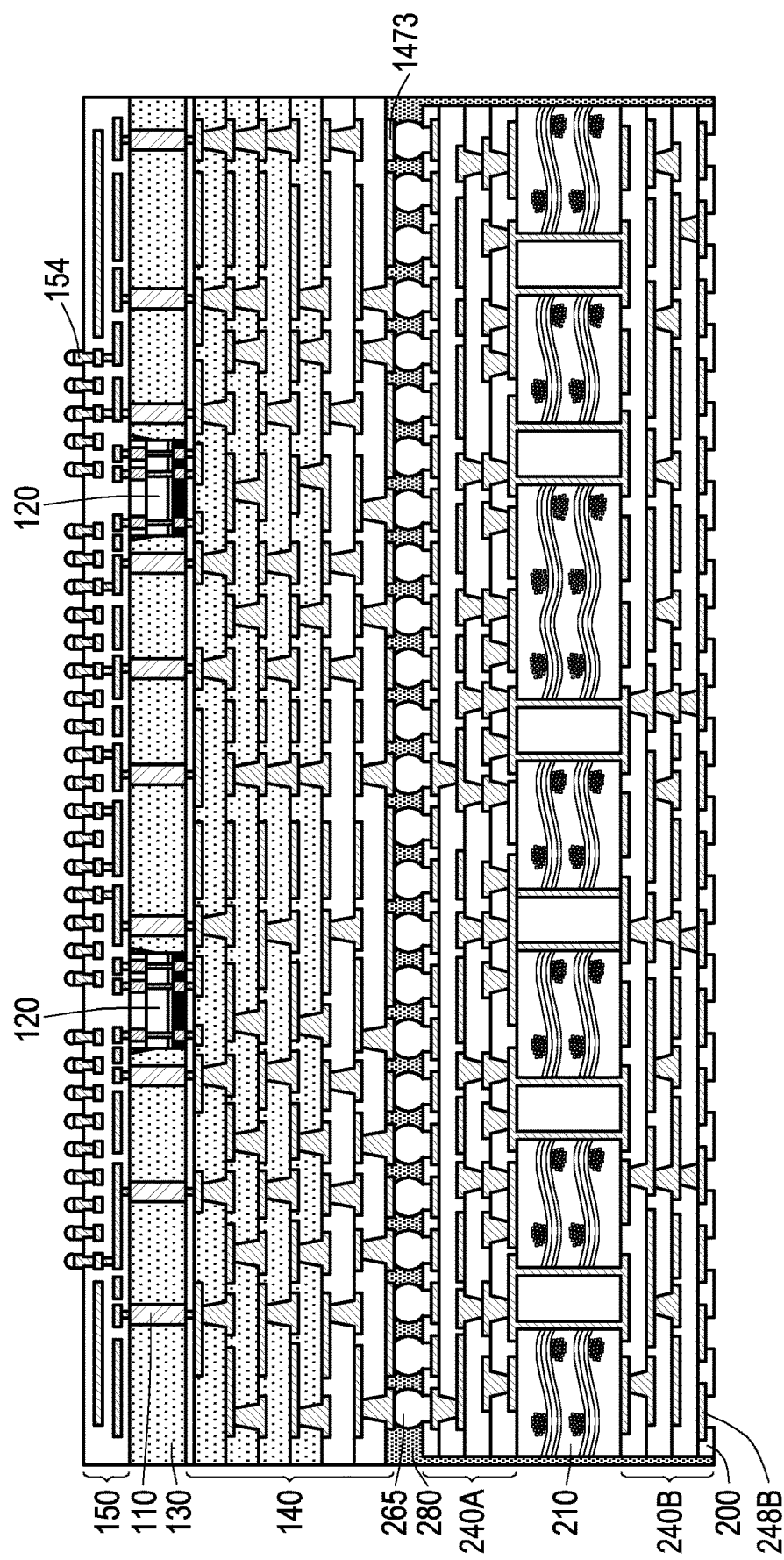
Figure 2M:
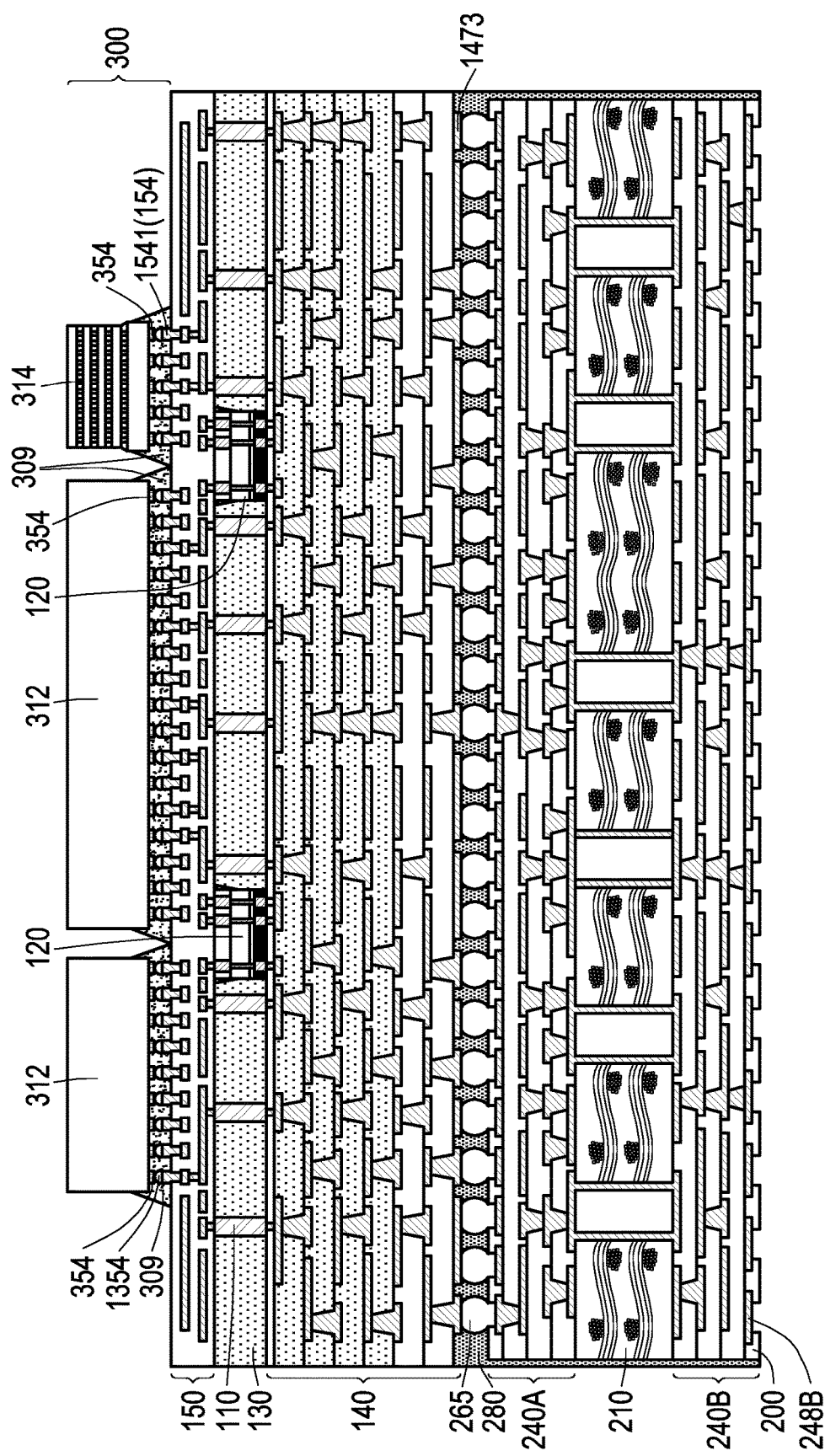
Figure 2N:
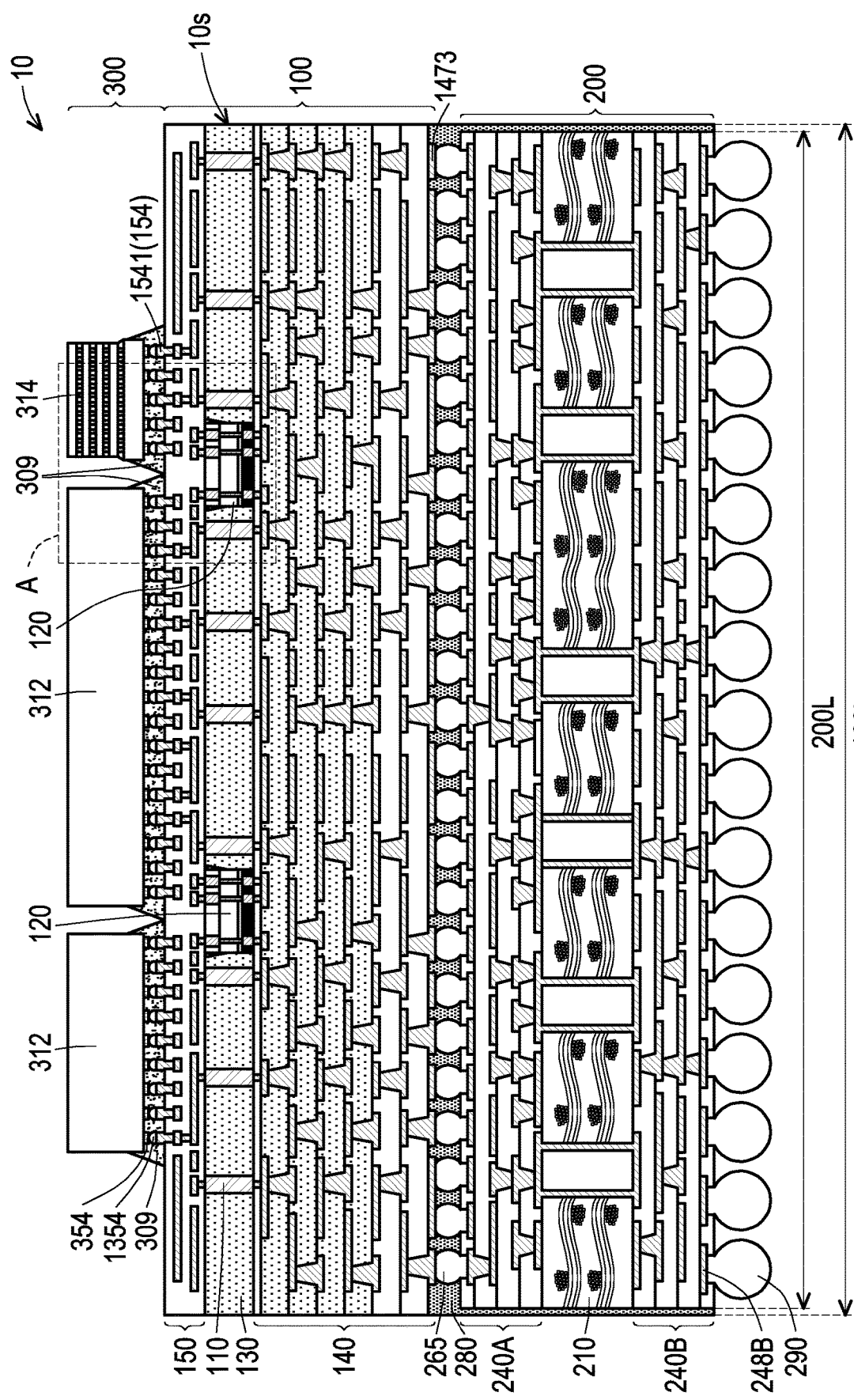
Figure 3A:
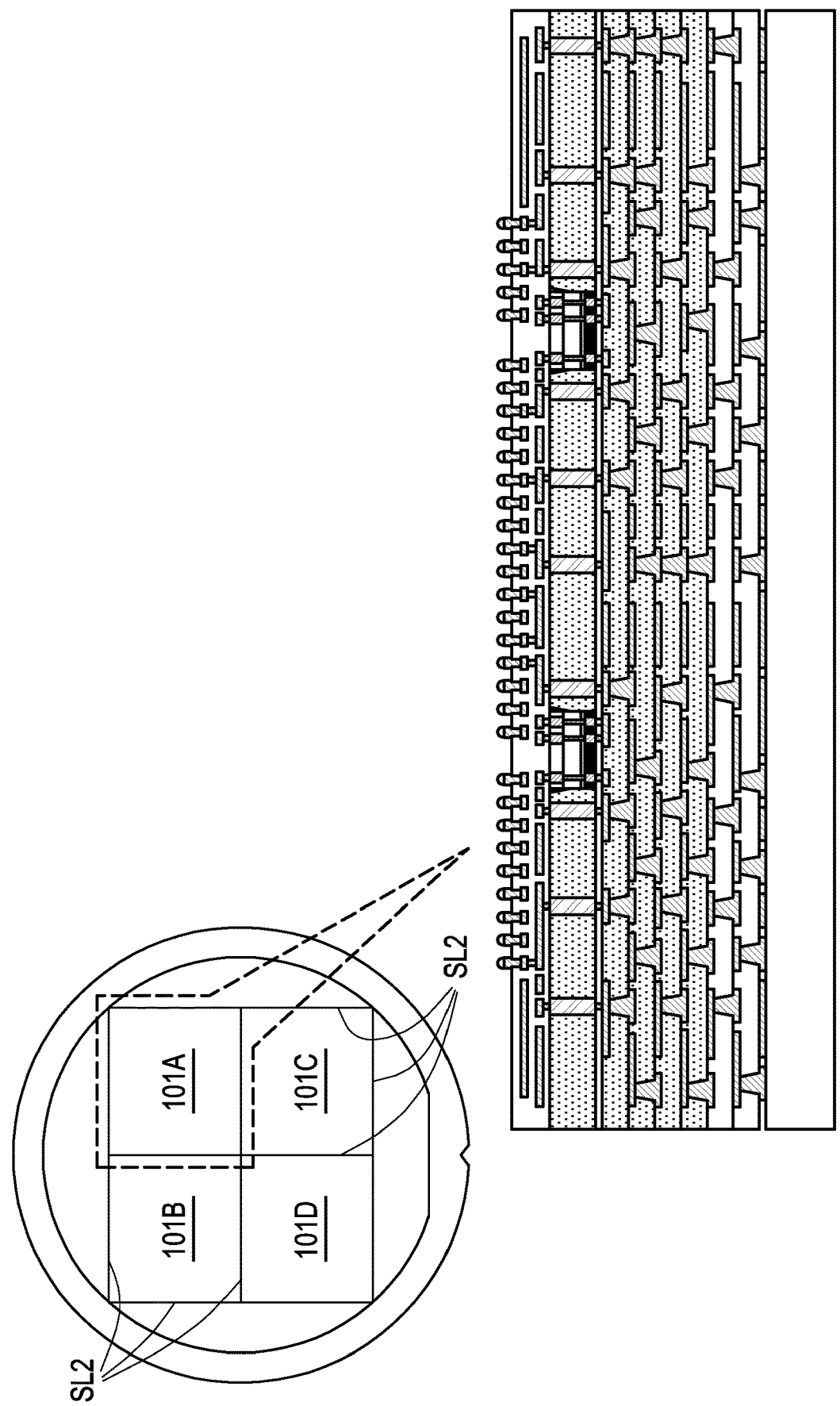
FIG. 3A is a schematic planar view of the layout of package regions on a wafer substrate in accordance with some embodiments.
Figure 4:
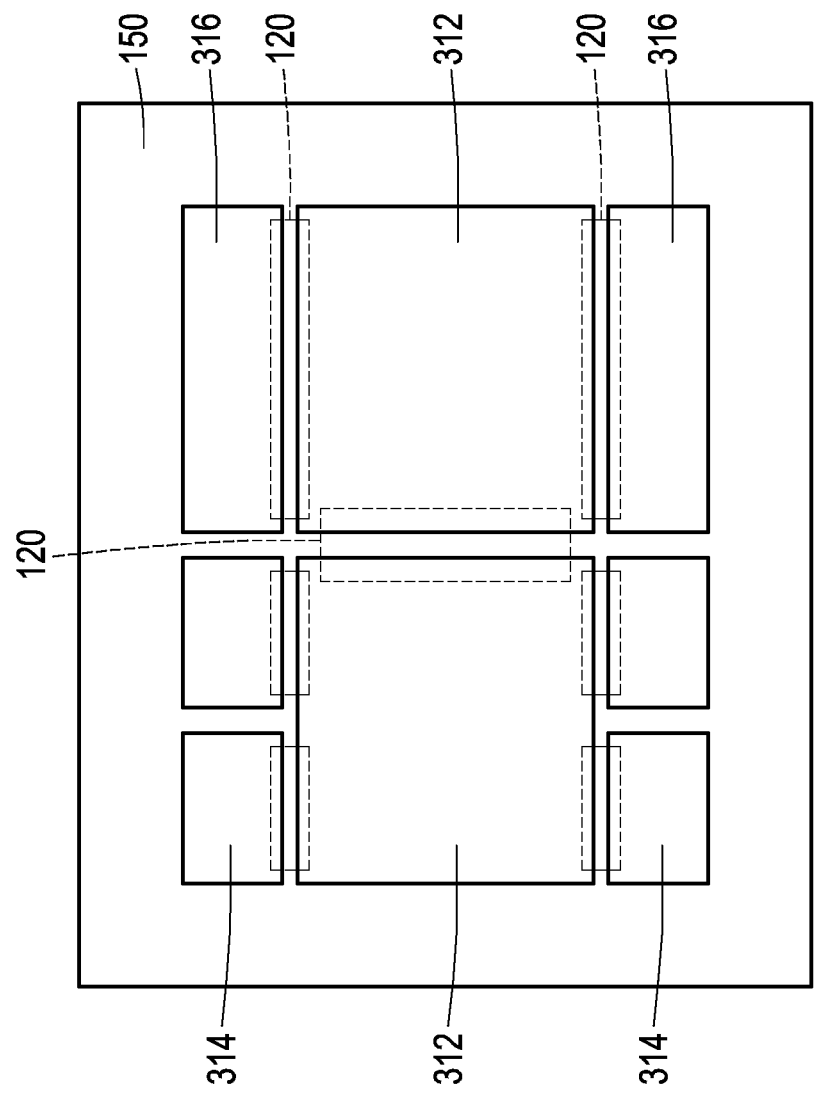
FIG. 4 is a schematic plan view of integrated circuit dies on a first distribution structure in accordance with some embodiments.
Figure 5:
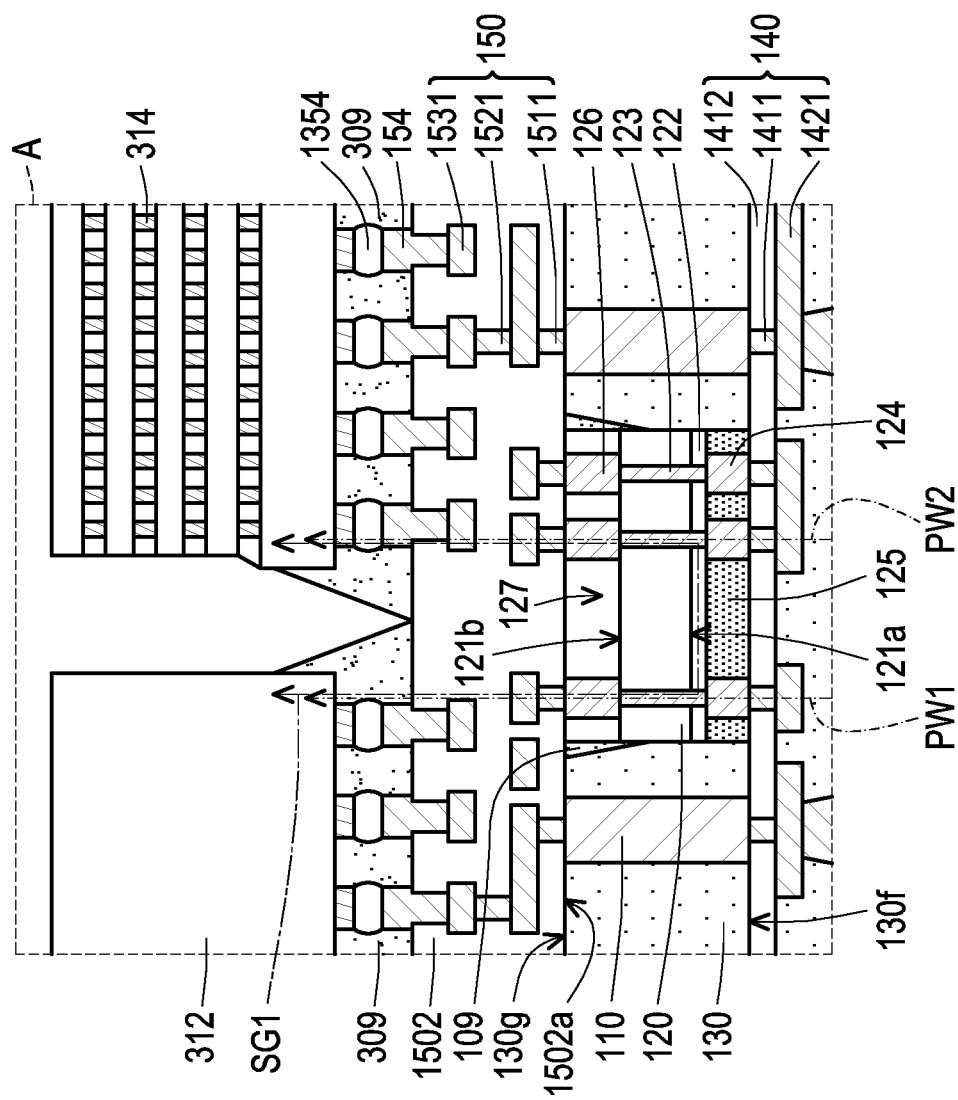
FIG. 5 is a schematic and enlarged view of the structure outlined in a dashed box A in FIG. 2N in accordance with some embodiments.

FIGS. 2A-2N are schematic cross-sectional views of structures produced at various stages of a manufacturing method of a semiconductor package, FIG. 3A is a schematic planar view of the layout of package regions on a wafer substrate, FIG. 3B is a schematic planar view of the layout of package regions on a panel substrate, FIG. 4 is a schematic plan view of integrated circuit dies on a first distribution structure, and FIG. 5 is a schematic and enlarged view of the structure outlined in a dashed box A in FIG. 2N, in accordance with some embodiments.

Referring to FIG. 2A, a plurality of sacrificial connectors 60 may be formed over a first temporary carrier 50A. The configuration of the sacrificial connectors 60 may correspond to that of the second conductive connectors of the local interconnect component. In some embodiments, the first temporary carrier 50A is provide with a release layer (not shown) which may be removed along with the first temporary carrier 50A from the overlying structures that will be formed in subsequent steps, and the sacrificial connectors 60 are formed on the release layer. The first temporary carrier 50A may be a glass carrier, a ceramic carrier, or any suitable carrier that can support the structure formed thereon during processing. The first temporary carrier 50A may be provided in a wafer form or a panel form, such that multiple semiconductor structures may be formed on the first temporary carrier 50A simultaneously in predetermined package regions (e.g., 101A-101D shown in FIG. 3A or 101A-101I shown in FIG. 3B).

In some embodiments, forming the sacrificial connectors 60 includes at least the following steps. A seed layer (not shown) may be first formed over the first temporary carrier 50A. Next, a photoresist may be formed and patterned on the seed layer. The patterning forms openings through the photoresist to expose the seed layer, where the openings in the photoresist correspond to the predetermined locations for the sacrificial connectors 60. Next, a conductive material (e.g., copper, titanium, tungsten, aluminum, or the like) may be formed in the openings of the photoresist and on the exposed portions of the seed layer. The photoresist and portions of the seed layer on which the conductive material is not formed may be removed. The combination of the conductive material and underlying portions of the seed layer form the pillar portions 62 of the sacrificial connectors 60. The height 62H of the pillar portion 62 may range from about 2 μm to about 50 μm. For example, the height 62H is about 8 μm.

In some embodiments, a solder material (e.g., Ni/Cu/Solder, Sn/Ag solder, or the like) is formed on the respective pillar portion 62, and a reflow process is performed on the solder material to form the cap portion 64 of the respective sacrificial connector 60. The maximum height 64H of the cap portion 62 may range from about 2 μm to about 50 μm. In some embodiments, the maximum height 64H of the cap portion 62 is about 15 μm and may be greater than the height 62H of the pillar portion 62. It should be noted that the step of forming the cap portions 64 may be omitted if the subsequently mounted component is provided with solder caps for jointing, and under this scenario, the pillar portion serves as the sacrificial connector (see FIG. 7).

Referring to FIG. 2B, a plurality of conductive pillars 1101 may be formed over the first temporary carrier 50A. The material and the forming process of the conductive pillars 1101 may be similar to those of the pillar portions 62 of the sacrificial connectors 60, and thus the detailed descriptions are not repeated for brevity. The conductive pillars 110 may surround each group of the sacrificial connectors 60 and may have a greater height than the overall height of the respective sacrificial connector 60.

Referring to FIG. 2C and with reference to FIG. 2B, the local interconnect components 120A may be mounted on the sacrificial connectors 60, and the conductive pillars 1101 may surround the respective local interconnect component 120A. For example, the local interconnect components 120A are picked and placed on the sacrificial connectors 60, where the second conductive connectors 126 may be substantially aligned with and in direct contact with the sacrificial connectors 60. A reflow process may be performed on the cap portions 64 of the sacrificial connectors 60 to form sacrificial joints 642 coupling the second conductive connectors 126 of the local interconnect components 120A to the pillar portions 62 of the sacrificial connectors 60.

In some embodiments, an underfill material 1091 is formed over the first temporary carrier 50A and in a gap between the respective local interconnect component 120A and the first temporary carrier 50A. The underfill material 1091 is formed by a capillary flow process after the local interconnect components 120A are attached, or may be formed by a suitable deposition method. For example, the underfill material 1091 surrounds the sacrificial joints 642 and the sacrificial connectors 60 for reducing stress and protection. The underfill material 1091 may (or may not) be spatially apart from the conductive pillars 1101 which surround the corresponding local interconnect component 120A. The underfill material 1091 may extend along the sidewall 120s of the respective local interconnect component 120A and laterally cover the second insulating layer 127. The underfill material 1091 may further extend to cover the semiconductor substrate 121, the interconnect structure 122, and/or the first insulating material layer 1251, depending on the dispensed amount of the underfill material 1091.

Referring to FIG. 2D and with reference to FIG. 2C, an encapsulating material layer 1301 may be formed over the first temporary carrier 50A. In some embodiments, the encapsulating material layer 1301 includes molding compound (e.g., epoxy resin or the like) and may be applied by compression molding, transfer molding, or the like. In alternative embodiments, the encapsulating material layer 1301 may be formed of pre-preg, Ajinomoto Build-up Film (ABF), resin coated copper (RCC), polyimide, photo-imageable dielectric (PID), or any suitable insulating material. The encapsulating material may be applied over the first temporary carrier 50A in liquid or semi-liquid form and then subsequently cured. The local interconnect components 120A, the underfill material 1091, and the conductive pillars 1101 may be buried in or covered by the encapsulating material. A planarization process (e.g., CMP, grinding, etching, a combination thereof, and/or another process) may be performed on the encapsulating material to form the encapsulating material layer 1301 which accessibly exposes the conductive pillars 1101.

In some embodiments, during the planarization process, a portion of the respective local interconnect component 120A is removed to form the local interconnect components 120. For example, the first insulating material layer 1251 is removed to form the first insulating layer 125 which accessibly reveals at least a portion of the respective first conductive connector 124. In some embodiments, after the planarization process, the first surface 130f of the encapsulating material layer 1301 may be substantially leveled (e.g., coplanar) with the first surfaces 110f of the conductive pillars 1101 and the first surfaces 120f of the local interconnect components 120, where the first surface 120f of the respective local interconnect component 120 includes the first surfaces 124f of the first conductive connectors 124 and the first surface 125f of the first insulating layer 125.

Still referring to FIG. 2D, the encapsulating material layer 1301 may laterally cover the underfill material 1091, and portions of the sidewalls 120s of the local interconnect components 120 that are not covered by the underfill material 1091 may be laterally covered by the encapsulating material layer 1301. In some embodiments where the first insulating layer 125 and the encapsulating material layer 1301 are of different materials, a visible interface is between the first insulating layer 125 and the encapsulating material layer 1301. In some embodiments, both of the first insulating layer 125 and the encapsulating material layer 1301 include molding compound, and the molding compound of the first insulating layer 125 may include smaller filler sizes than the fillers in the molding compound of the encapsulating material layer 1301. In some embodiments where the first insulating layer 125 and the encapsulating material layer 1301 are of the same molding material, no visible interface can be found therebetween.

Referring to FIG. 2E and with reference to FIG. 2D, a first redistribution structure 140 may be formed on the encapsulating material layer 1301, the conductive pillars 1101, and the local interconnect components 120. Although the first redistribution structure 140 is shown as an example having seven layers (141, 142, 143, 144, 145, 146, and 147), more or fewer layers may be formed in the first redistribution structure 140. If fewer layers are to be formed, steps and processes discussed below may be omitted. If more layers are to be formed, steps and processes discussed below may be repeated.

In some embodiments, the formation of the first redistribution structure 140 starts with forming the first layer 141 on the encapsulating material layer 1301, the conductive pillars 1101, and the local interconnect components 120. The first layer 141 may include a first conductive pattern 1411 and a first dielectric layer 1412 covering the first conductive pattern 1411. In some embodiments, the first conductive pattern 1411 only includes conductive vias. Alternatively, the first conductive pattern 1411 may further include conductive pads and conductive lines. As an example to form the conductive vias of the first conductive pattern 1411, a seed layer (not shown) is first formed on the encapsulating material layer 1301, the conductive pillars 1101, and the local interconnect components 120. A photoresist with openings is then formed on the seed layer. A conductive material (e.g., copper, titanium, tungsten, aluminum, or the like) is then formed in the openings of the photoresist and on the exposed portions of the seed layer. The photoresist and portions of the seed layer on which the conductive material is not formed are removed. The combination of the conductive material and underlying portions of the seed layer form the conductive vias of the first conductive pattern 1411, where the conductive vias may have substantially vertical sidewalls. The first dielectric layer 1412 is then formed on the encapsulating material layer 1301 to cover the first conductive pattern 1411.

In alternative embodiments, the first dielectric layer 1412 having openings is first formed on the encapsulating material layer 1301, and then the conductive vias of the first conductive pattern 1411 is formed in the openings of the first dielectric layer 1412, where the conductive vias may have tilted sidewalls and may be tapered toward the conductive pillars 1101 and/or the local interconnect components 120. In some embodiments, the first dielectric layer 1412 and the underlying encapsulating material layer 1301 are of different materials, where the encapsulating material layer 1301 may be more rigid than the first dielectric layer 1412. The first dielectric layer 1412 may be a polymer (e.g., PBO, polyimide, BCB, or the like), a nitride, an oxide, a combination thereof, and/or the like, and may be formed by coating, lamination, or any suitable deposition process.

The first conductive pattern 1411 may be physically and electrically connected to the first conductive connectors 124 of the local interconnect components 120 and the conductive pillars 1101. For example, the conductive vias of the first conductive pattern 1411 land on the first surfaces 124*f* of the first conductive connectors 124 and the first surfaces 110*f* of the conductive pillars 1101. The first dielectric layer 1412 may laterally cover the first conductive pattern 1411 and may be in direct contact with the first surface 130*f* of the encapsulating material layer 1301 and the first surfaces 120*f* of the local interconnect components 120. The first dielectric layer 1412 may also cover the first surface 125*f* of the first insulating layer 125, portions of the first surfaces 110*f* of the conductive pillars 1101, and the portions of the first conductive connectors 124. A planarization process is optionally performed. The upper surfaces of the first dielectric layer 1412 and the first conductive pattern 1411 may be substantially level (e.g., planar) within process variations, and polish marks may be observed on the upper surface of the first dielectric layer 1412.

With continued reference to FIG. 2E, the second layer 142 may be formed on the first layer 141. The second layer 142 includes a second conductive pattern 1421 (e.g., conductive pads, conductive vias, and conductive lines) and a second dielectric layer 1422. For example, the conductive pads of the second conductive pattern 1421 may be in physical and electrical contact with the conductive vias of the first conductive pattern 1411, the conductive lines of the second conductive pattern 1421 may be formed on the first dielectric layer 1412 and connected to the conductive pads of the second conductive pattern 1421, and the conductive vias of the second conductive pattern 1421 may land on the conductive pads of the second conductive pattern 1421, where the conductive vias of the second conductive pattern 1421 may have tilted sidewalls that are tapered toward the first layer 141. Alternatively, the conductive vias of the second conductive pattern 1421 may have substantially vertical sidewalls. The second dielectric layer 1422 may be formed on the first dielectric layer 1412 to cover the second conductive pattern 1421. In some embodiments, the second dielectric layer 1422 and the underlying first dielectric layer 1412 are of different materials, where the second dielectric layer 1422 is more rigid than the first dielectric layer 1412, and a visible interface is formed therebetween. Alternatively, the first dielectric layer 1412 and the second dielectric layer 1422 are made of the same/similar material, and no visible interface can be found therebetween.

Still referring to FIG. 2E, the steps discussed above to form the second layer 142 may be repeated one or more times to form additionally shown layers (143, 144, 145, 146, and 147) in order to provide additional routing layers as desired for a particular design. The conductive patterns for each layer (143, 144, 145, 146, and 147) may have separately formed conductive pads, conductive lines, and conductive vias. The dielectric layers may be stacked upon one another, and the material(s) of the dielectric layers at each layer may be the same as the adjacent layer(s) or may be different from the adjacent layer(s). It should be noted that the material(s) of the dielectric layers of the first redistribution structure 140 may depend on warpage analysis for reducing the CTE mismatch. In some embodiments, an additional set of conductive pattern 1473 are formed over the uppermost layer, e.g., the layer 147 in the illustrated embodiment. The conductive pattern 1473 may provide a larger dimensional footprint for connecting a substrate component as will be discussed later in FIG. 2J.

Referring to FIG. 2F and with reference to FIG. 2E, the structure shown in FIG. 2E may be transferred to be placed on a second temporary carrier 50B, and the first temporary carrier 50A may be released through a de-bonding process. In some embodiments where the first temporary carrier 50A is provided with a release layer, the de-bonding process includes applying energy to the release layer so that the release layer decomposes under the heat of the energy and the first temporary carrier 50A may thus be removed. Alternatively, other suitable removal technique (e.g., peeling, grinding, etc.) may be used to release the first temporary carrier 50A. After removing the first temporary carrier 50A, the encapsulating material layer 1301, the conductive pillars 1101, the underfill material 1091, and the pillar portions of the sacrificial connectors 60 are accessibly exposed. In some embodiments, the structure is flipped over and placed on the second temporary carrier 50B. The second temporary carrier 50B may be the same as or similar to the first temporary carrier 50A. The conductive pattern 1473 may be in direct contact with the second temporary carrier 50B. In some embodiments, the second temporary carrier 50B may be provided with a release layer (not individually illustrated), and the conductive pattern 1473 may be attached to the release layer.

Referring to FIG. 2G and with reference to FIG. 2F, the sacrificial connectors 60 and the sacrificial joints 642 may be removed until the second conductive connectors 126 are accessibly exposed. For example, a grinding process is performed to remove the sacrificial connectors 60 and the sacrificial joints 642. Other suitable removal technique (e.g., CMP, etching, a combination thereof, or the like) may be used. In some embodiments, during the removal process of the sacrificial connectors 60, a major portion of the underfill material 1091 may be removed, and a small amount of the underfill material 1091 is left to form the underfill layer 109 laterally covering the sidewalls 120*s* of the local interconnect components 120.

In some embodiments, during the removal process, the encapsulating material layer 1301, the conductive pillars 1101, and the underfill material 1091 are thinned to form the insulating encapsulation 130, the through insulating vias (TIVs) 110, and the underfill layer 109, respectively. The insulating encapsulation 130 may have a thickness 130T in a range from about 5 µm to about 100 µm. For example, the second surface 130*g* of the insulating encapsulation 130, the second surfaces 110*g* of the TIVs 110, the surface 109*g* of the underfill layer 109, and the second surfaces 120*g* of the local interconnect components 120 are substantially level (e.g., coplanar) within process variations, where the second surfaces 120*g* may include the surface 126*g* of the second conductive connectors 126 and the surface 127*g* of the second insulating layer 127. The grinding marks may be found on these surfaces. After the planarization process (if any), the thickness of the local interconnect component 120 may be in a range from about 10 µm to about 100 µm.

Referring to FIG. 2H and with reference to FIG. 2G, a second redistribution structure 150 may be formed on the insulating encapsulation 130, the TIVs 110, and the local interconnect components 120. Although the second redistribution structure 150 is shown as an example having three layers (151, 152, and 153), more or fewer layers may be formed in the second redistribution structure 150. In some embodiments, dielectric layers covering the conductive patterns in each of the layers (151, 152, and 153) may have the same/similar material and may be collectively viewed as the dielectric layer 1502. Alternatively, dielectric layers in each of the layers (151, 152, and 153) are of different materials, and visible interfaces are formed in adjacent dielectric layers. In some embodiments, the dielectric layer 1502 has a thickness 1502T in a range from about 2 µm to about 50 µm.

In some embodiments, the first conductive pattern 1511 in the first layer 151 is formed on the second surfaces 110g of the TIVs 110 and the surface 126g of the second conductive connectors 126. The interface between the first conductive pattern 1511 and the second conductive connectors 126 may be solder-free, and thus a low contact resistance may be achieved. For example, the first conductive pattern 1511 only includes conductive vias that have substantially vertical sidewalls. The forming process of the first conductive pattern 1511 may be similar to the first conductive pattern 1411 described in FIG. 2E. The second conductive pattern 1521 may include conductive pads, conductive lines, and conductive vias, where the conductive pads of the second conductive pattern 1521 are in physical and electrical contact with the conductive vias of the first conductive pattern 1511. Similarly, the third conductive pattern 1531 may be formed on the second conductive pattern 1521.

With continued reference to FIG. 2H, a plurality of conductive bumps 154 may be formed on the second redistribution structure 150. The conductive bumps 154 may be electrically coupled to the local interconnect components 120 through the conductive patterns in the second redistribution structure 150. In some embodiments, the conductive bumps 154 have a pitch in a range from about 20 µm to about 80 µm. The conductive bumps 154 may be or may include ball grid array (BGA) connectors, solder balls, metal pillars, controlled collapse chip connection (C4) bumps, micro bumps, electroless nickel-electroless palladium-immersion gold (ENEPIG) technique formed bumps, or the like. In some embodiments, the respective conductive bump 154 includes a bump portion 1541 and a cap portion 1542 overlying the bump portion 1541. For example, the bump portions 1541 are directly connected to the conductive vias of the third conductive pattern 1531 and may be formed of the same material as the conductive vias. The bump portions 1541 may be solder free and have substantially vertical sidewalls. Although the bump portions 1541 may have other suitable conductive material(s) and have other shape. In some embodiments, the bump portions 1541 are under-bump metallization (UBM) pads. The cap portions 1542 may have a different material (e.g., solder material) than the bump portions 1541 and may allow for physical and electrical connection to dies or another package component.

Still referring to FIG. 2H and with reference to FIGS. 3A-3B, as mentioned in FIG. 2A, multiple package regions may be simultaneously formed. In the embodiment shown in FIG. 3A, four package regions (101A, 101B, 101C, and 101D) are included on the wafer allowing for four package components to be fabricated on a single wafer and later singulated. Fewer or more package regions may be utilized on a single wafer in other embodiments. Subsequent steps in the process use the structure on a wafer form tape frame 70 as the base upon which to continue the fabrication process described in further detail below. As described in further detail below, the individual package regions are singulated by sawing along scribe lines SL2 and around the outer edges of package regions (101A, 101B, 101C, and 101D).

In the embodiment shown in FIG. 3B, the structure is manufactured using a panel form fabrication process with nine package regions (101A through 101I). These package regions are included on the panel allowing for nine package components to be fabricated on a single panel. Fewer or more package regions may be utilized on a single panel in other embodiments. Subsequent steps in the process use the structure on a panel form tape frame 70 as the base upon which to continue the fabrication process described in further detail below. As described in further detail below, the individual package regions are singulated by sawing along scribe lines and around the perimeter of package regions (101A through 101I).

Referring back to FIG. 2I and with reference to FIG. 2H, the structure shown in FIG. 2E may be transferred to be placed on the tape frame 70, and the second temporary carrier 50B may be released through a de-bonding process. The de-bonding process of the second temporary carrier 50B may be similar to that of the first temporary carrier 50A described in FIG. 2F. After the de-bonding process of the second temporary carrier 50B, the conductive pattern 1473 on the first redistribution structure 140 may be accessibly revealed. In some embodiments, the structure is then flipped over and placed on the tape frame 70, where the conductive bumps 154 may face downward and the outermost surface of the second redistribution structure 150 may be disposed on the tape frame 70.

Referring to FIG. 2J, a substrate component 200 is provided and may be bonded the first redistribution structure 140. In some embodiments, a plurality of substrate components 200 is provided, and each of the substrate components 200 is coupled to the first redistribution structure 140 of one of the package regions (e.g., 101A-101D shown in FIG. 3A or 101A-101I shown in FIG. 3B). The substrate component 200 may be or may include an organic substrate, a ceramic substrate, a silicon substrate, or the like. The substrate component 200 may include active and passive devices (not shown), or may be free from either active devices, passive devices, or both. Utilizing the substrate component 200 has the advantage of having the substrate component 200 being manufactured in a separate process. In some embodiments, because the substrate component 200 is formed in a separate process, the substrate component 200 may be individually or batch tested, validated, and/or verified prior to bonding the substrate component 200 to the first redistribution structure 140.

Before being coupled to the first redistribution structure 140, the substrate component 200 may be processed according to applicable manufacturing processes to form redistribution structures in the substrate component 200. In some embodiments, the substrate component 200 is a core substrate which includes a core layer 210. The core layer 210 may be formed of organic and/or inorganic materials. For example, the core layer 210 may include one or more layers of glass fiber, resin, filler, pre-preg, epoxy, silica filler, ABF, polyimide, molding compound, other materials, and/or combinations thereof. In some embodiments, the core layer 210 includes one or more passive components (not shown) embedded inside. The core layer 210 may include other materials or components. Alternatively, the substrate component 200 is a coreless substrate. The substrate component 200A may include through core vias 220 extending through the core layer 210 for providing vertical electrical connections between two opposing sides of the core layer 210. In some embodiments, the through core vias 220 are hollow through vias having centers that are filled with an insulating material. In some embodiments, the through core vias 220 are solid conductive pillars.

In some embodiments, the substrate component 200 includes a third redistribution structure 240A and a fourth redistribution structure 240B electrically coupled by the through core vias 220, and fan-in/fan-out electrical signals. For example, some of the through core vias 220 are coupled between conductive features of the third redistribution structure 240A at one side of the core layer 210 and conductive features of the fourth redistribution structure 240B at an opposite side of the core layer 210. The third and fourth redistribution structures 240A and 240B each include dielectric layers, formed of ABF, pre-preg, or the like, and metallization patterns. Each respective metallization pattern has line portions on and extending along a major surface of a respective dielectric layer, and has via portions extending through the respective dielectric layer. More or fewer dielectric layers and metallization patterns may be formed in the third and fourth redistribution structures 240A and 240B than shown in FIG. 2J. The third and fourth redistribution structures 240A and 240B each, respectively, include UBM pads 248A and 248B for external connection, and solder resists 246A and 246B protecting the features of the third and fourth redistribution structures 240A and 240B.

With continued reference to FIG. 2J, the third redistribution structure 240A may be attached to the conductive pattern 1473 on the first redistribution structure 140 by the UBM pads 248A through conductive joints 265. For example, attaching the substrate component 200 includes placing conductive bumps of the substrate component 200 on the conductive pattern 1473 over the first redistribution structure 140 and reflowing the conductive bumps to form the conductive joints (or solder connections) 265 that are physically and electrically coupled the substrate component 200 and the conductive pattern 1473 on the first redistribution structure 140. The conductive bumps may be BGA connectors, solder balls, metal pillars, C4 bumps, micro bumps, ENEPIG formed bumps, or the like. In some embodiments, the conductive bumps are first formed on either the substrate component 200 or the conductive pattern 1473, and then reflowed to complete the bond.

Referring to FIG. 2K, a protective layer 280 may be formed in a gap between the first redistribution structure 140 and the substrate component 200 to securely bond the associated elements and provide structural support and environmental protection. For example, the protective layer 280 surrounds the conductive joints 265, the conductive pattern 1473, and the exposed surfaces of dielectric layers of the first redistribution structure 140 and the third redistribution structure 240A. The protective layer 280 may extend to cover at least a portion of the sidewall 200s of the substrate component 200. In some embodiments, the protective layer 280 covers the entirety of the sidewall 200s of the substrate component 200, where the sidewall 200s includes outer sidewalls of the core layer 210 and the third and fourth redistribution structures 240A and 240B.

In some embodiments, the protective layer 280 is formed of molding compound, molding underfill, epoxy, or the like, and may be applied by compression molding, transfer molding, or the like. For example, a molding material is formed over the tape frame 70 such that substrate component 200 may be buried or covered. A planarization process and/or a cleaning process may be performed, if necessary, on the molding material to form the protective layer 280 that accessibly exposes the UBM pads 248B of the substrate component 200. In some embodiments, the planarization may be omitted, if the UBM pads 248B are already exposed. Other processes may be used to achieve a similar result. In some embodiments, the protective layer 280 is formed of an underfill material, and may be dispensed by a capillary flow process or the like. The protective layer 280 may be applied in liquid or semi-liquid form and then subsequently cured.

Referring to FIGS. 2L-2M and with reference to FIG. 2K, the structure is removed from the tape frame 70 through a de-taping process in order to accessibly expose the conductive bumps 154 for further processing. In some embodiments, after the de-taping process, the structure is flipped over and placed on another tape frame (not shown) for the subsequent mounting process, where the substrate component 200 may be attached to the tape frame. In some embodiments, an integrated circuit (IC) package component 300 is mounted on the second redistribution structure 150 through the conductive bumps 154.

The IC package component 300 may include IC dies such as one or more logic dies (e.g., central processing unit (CPU), graphics processing unit (GPU), system-on-a-chip (SoC), application processor (AP), microcontroller, etc.), one or more memory dies (e.g., dynamic random access memory (DRAM) die, static random access memory (SRAM) die, etc.), one or more power management dies (e.g., power management integrated circuit (PMIC) die), one or more radio frequency (RF) dies, one or more sensor dies, one or more micro-electro-mechanical-system (MEMS) dies, one or more signal processing dies (e.g., digital signal processing (DSP) die), one or more front-end dies (e.g., analog front-end (AFE) dies), one or more input/output (I/O) dies, the like, or combinations thereof.

The embodiment illustrated in FIG. 4 includes two logic dies 312, four memory dies 314, and two I/O dies 316. In some embodiments, each of the IC dies is connected to each adjacent IC die by one of the local interconnect components 120. In the cross-sectional view in FIG. 2M, the local interconnect components 120 are disposed below these IC dies for interconnecting therebetween. In the top-down view of FIG. 4, the respective local interconnect component 120 is disposed between two adjacent IC dies and overlaps these two adjacent IC dies. In the illustrated embodiment, each of the memory dies 314 and the I/O dies 316 are connected to at least one of the logic dies 312 by the respective local interconnect component 120. The two logic dies 312 may be connected together by the local interconnect component 120. Other embodiments may include more or less logic dies, memory dies, I/O dies, and local interconnect components.

The IC dies (312, 314, and/or 316) may be formed in one or more wafers, which may include different device regions that are singulated in subsequent steps. The IC dies (312, 314, and/or 316) may be packaged with other similar or different IC dies using suitable FEOL and BEOL techniques. one or more of the IC dies (312, 314, and 316) may be stacked devices that include multiple semiconductor substrates. For example, the memory die 314 includes a memory device such as a hybrid memory cube (HMC) module, a high bandwidth memory (HBM) module, or the like. In such embodiments, the memory die 314 includes multiple tiers of semiconductor substrates interconnected by inter-tier vias. Each of the semiconductor substrates may (or may not) have an interconnect structure.

With continued reference to FIG. 2M, The IC dies (312, 314, and 316) may have bond pads 354 that are bonded to the conductive bumps 154. In some embodiments, the IC dies (312, 314, and 316) may be picked and placed over the second redistribution structure 150 and bonded to the conductive bumps 154 by flip-chip bonding process or other suitable bonding process. In some embodiments, the cap portions of the conductive bumps 154 are reflowed to form conductive joints (or solder connections) 1354 coupling the bond pads 354 of the IC dies (312, 314, and 316) to the pillar portions 1541 of the conductive bumps 154 on the second redistribution structure 150. The conductive joints 1354 may provide electrical connection between the IC dies (312, 314, and 316) and the underlying second redistribution structure 150.

Still referring to FIG. 2M, an underfill layer 309 may be formed in a gap between the IC dies (312, 314, and 316) and the second redistribution structure 150 to securely bond the IC dies (312, 314, and 316) to the second redistribution structure 150 and to provide structural support and environmental protection. In some embodiments, the material of the underfill layer 309 is the same as or similar to the material of the underfill layer 109 (see FIG. 2G) laterally covering the local interconnect components 120. The underfill layer 309 may be formed by a capillary flow process after the IC dies (312, 314, and 316) are attached, or may be formed by a suitable deposition method. The underfill layer 309 may surround the bond pads 354, the conductive joints 1354, and the pillar portions 1541 of the conductive bumps 154. The underfill layer 309 may reduce stress and protect the joints resulting from the reflowing of the conductive joints 1354. The underfill layer 309 may extend to partially or completely cover the sidewalls of the IC dies (312, 314, and/or 316). Alternatively, the underfill layer 309 is omitted or may be replaced with a molding compound or a molding underfill that covers the IC dies for protection.

Referring to FIG. 2N, a plurality of external terminals 290 may be formed on the UBM pads 248B of the substrate component 200. The external terminals 290 may include a conductive material such as solder, copper, aluminum, gold, nickel, silver, palladium, tin, the like, or a combination thereof. The external terminals 290 may be BGA connectors, solder balls, metal pillars, C4 bumps, micro bumps, or the like. The size (e.g., the diameter) of the external terminals 290 may be greater than the size of the conductive joints 265 and may be greater than the size of the conductive joints 1354. In a given area, the density of the external terminals 290 may be less than that of the conductive joints 265, and the density of the conductive joints 265 may be less than that of the conductive joints 1354.

In some embodiments, a singulation process is performed to form a semiconductor package 10 having a coterminous sidewall 10s, where the sidewall 10s may include outer sidewalls of the second redistribution structure 150, the underlying insulating encapsulation 130, the underlying first redistribution structure 140, and the underlying protective layer 280. The semiconductor package 10 may include the IC package component 300, the composite redistribution structure 100 underlying the IC package component 300, the substrate component 300 underlying the composite redistribution structure 100, and the external terminals 290 underlying the substrate component 300, among other elements. The substrate component 200 may have a lateral dimension 200L less than the lateral dimension 100L of the composite redistribution structure 100.

The composite redistribution structure 100 includes the first and second redistribution structures 140 and 150 disposed at two opposing sides of the respective local interconnect component 120, the TIVs 110, or the insulating encapsulation 130. Given their placement in the semiconductor package 10, the first redistribution structure 140 may be viewed as a substrate-side redistribution structure, while the second redistribution structure 150 may be viewed as a die-side redistribution structure. The composite redistribution structure 100 may provide electrical pathing and connection between the IC package component 300 and the substrate component 200. The composite redistribution structure 100 includes one or more local interconnect components 120, where the local interconnect components 120 provide electrical routing and connection between the IC dies of the IC package component 300. In some embodiments, the local interconnect components 120 are referred to as interconnecting dies or bridge dies.

With continued reference to FIG. 2N and also referring to FIG. 5, the semiconductor substrate 121 of the local interconnect component 120 includes the first surface 121a and the second surface 121b located between the first and second surfaces 130f and 130g of the insulating encapsulation 130. The second insulating layer 127 of the local interconnect component 120 may be in direct contact with the first surface 1502a of the dielectric layer 1502 of the second redistribution structure 150, while the first insulating layer 125 of the local interconnect component 120 may be in direct contact with the first dielectric layer 1412 of the first redistribution structure 140.

The local interconnect component 120 may provide interconnection functionality between the IC dies 312 and 314 (and/or 316 labeled in FIG. 4). For example, the IC dies 312 and 314 are electrically coupled to each other through a signal connection SG1. In some embodiments, the signal connection SG1 is implemented as an electrical path formed by the conductive joints 1354, the conductive bumps 154, the conductive patterns (1511, 1521, and 1531) in the second redistribution structure 150, and the second conductive connectors 126, the TSVs 123, and the interconnect structure 122 in the local interconnect component 120. In such configuration, a length of a signal connection path from the IC die 312 to the IC die 314 (or form the IC die 314 to the IC die 312) may be minimized. By configuring the local interconnect components 120, the communication bandwidth between the IC dies may be increased while maintaining low contact resistance and high reliability. Due to the increased communication bandwidth between the IC dies provided by the local interconnect components 120, an interposer is not required between the IC dies and the composite redistribution structure 100. By removing the need for an interposer, the warpage mismatch in the semiconductor package 10 is reduced because the CTE mismatch is reduced.

In some embodiments, a power supply component (not shown) may be configured to supply power to one or more IC dies 312 and 314 (and/or 316 labeled in FIG. 4) through power connections PW1 and PW2. For example, the power supply component may be a power supply die disposed over the second redistribution structure 150 and next to the IC dies or may be disposed below the substrate component 200 and mounted thereon through the external terminals 290. For example, the power connections PW1 and PW2 may be implemented as an electrical path formed by the conductive patterns (1411 and 1421) in the first redistribution structure 140, the conductive joints 1354, the conductive bumps 154, the first conductive connectors 124, the interconnect structure 122, the TSVs 123, and the second conductive connectors 126 in the local interconnect component 120, the conductive patterns (1511, 1521, and 1531) in the second redistribution structure 150, the conductive bumps 154, and the conductive joints 1354.

Compared to embodiments where the local interconnect component is free of TSV, the power connection path passing through the TIVs 110 and the local interconnect component includes an additional lateral length corresponding to a lateral distance between the TIV and the local interconnect component, thereby worsening the power performance of the resulting package. The shorter the lengths of the power connection paths, the lower the power delivery network (PDN) impedance and the better the power performance of the semiconductor package. In the configuration in FIG. 5, a length of a power connection path from the power supply component to the IC dies may be minimized, which results in one or more effects including, but not limited to, low PDN impedance, small voltage variation, and low power consumption.

Figure 6:
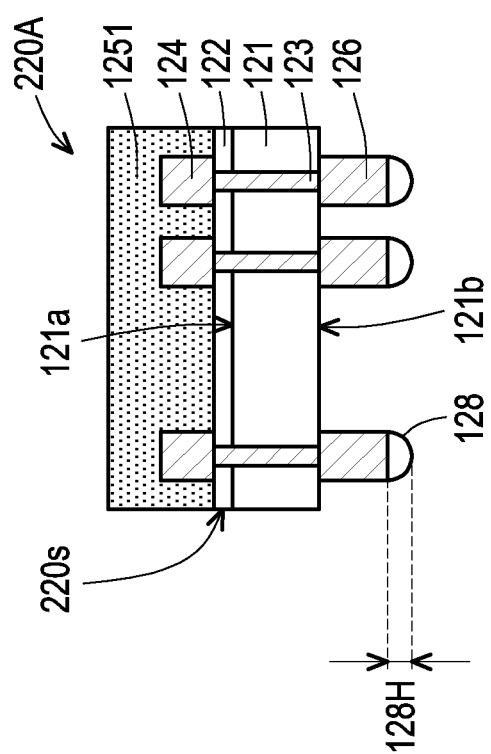
FIG. 6 is a schematic cross-sectional view of a local interconnect component according to some embodiments.

FIG. 6 is a schematic cross-sectional view of a local interconnect component according to some embodiments. Referring to FIG. 6 and with reference to FIG. 1H, the local interconnect component 220A in FIG. 6 is similar to the local interconnect component 120A in FIG. 1H, except that in this embodiment, the second insulating layer 127 is omitted. For example, in this embodiment, the process starts with the step described in FIG. 1A and proceeds to the step described in FIG. 1F, and then cap portions 128 may be formed on the pillar portions 126. The maximum height 128H of the cap portion 128 may range from about 2 μm to about 50 μm. For example, the maximum height 128H of the cap portion 128 is about 15 μm. In alternative embodiments, the cap portions 128 are omitted. Afterwards, the singulation process may be performed to form a plurality of local interconnect components 220A with a coterminous sidewall 220s, where the sidewall 220s includes the outer sidewalls of the first insulating material layer 1251, the interconnect structure 122, and the semiconductor substrate 121. As shown in FIG. 6, the second surface 121b of the semiconductor substrate 121 is unmasked, except for the area on which the pillar portions 126 are formed. Details regarding this embodiment that are similar to those for the previously described embodiments in FIGS. 1A-1H will not be repeated herein.

Figure 7A:
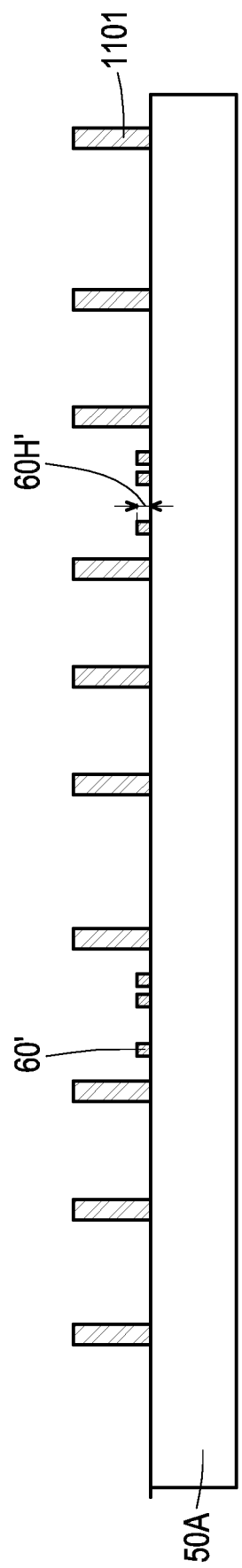
FIGS. 7A-7C are schematic cross-sectional views of structures produced at various stages of a manufacturing method of a semiconductor package according to some embodiments.
Figure 7B:
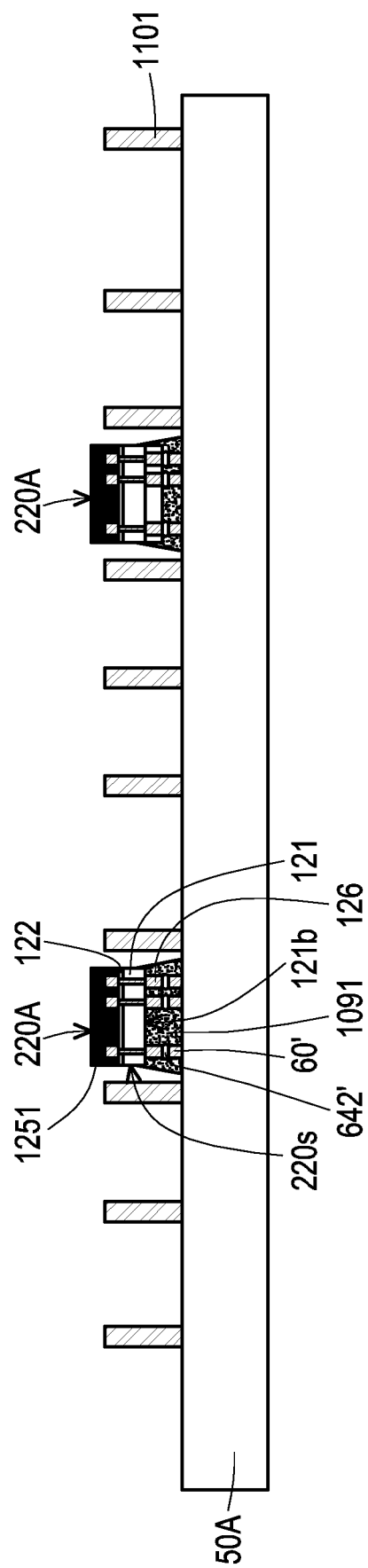
Figure 7C:
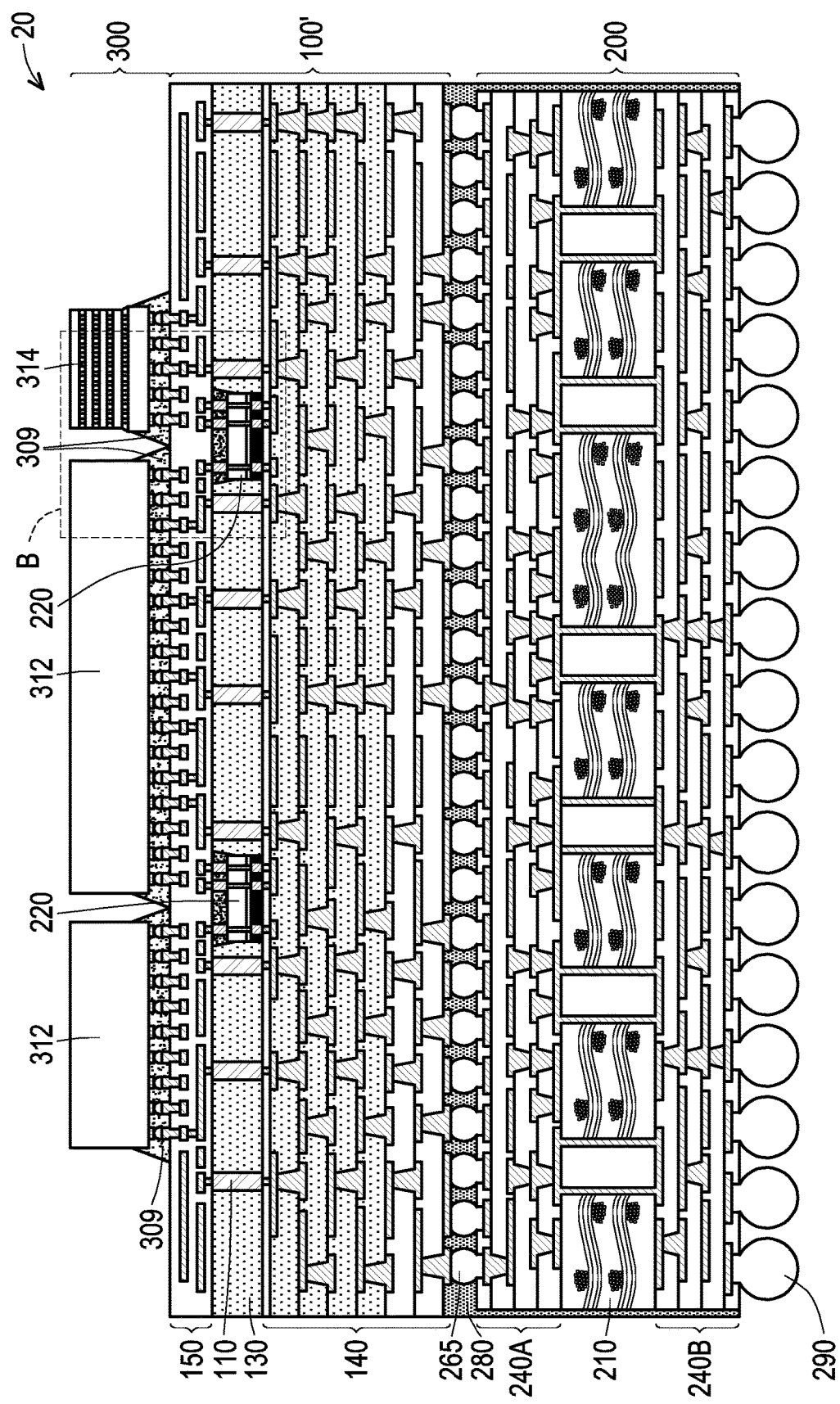
Figure 8:
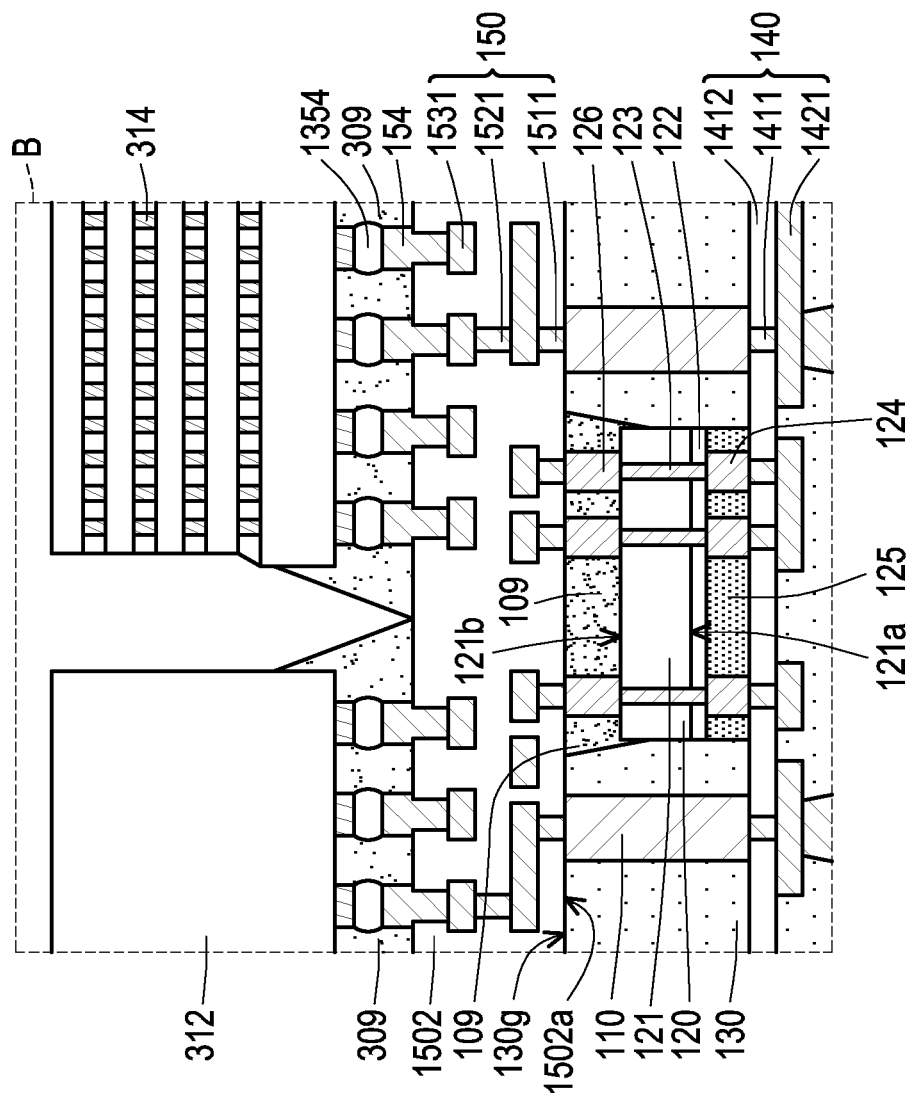
FIG. 8 is a schematic and enlarged view of the structure outlined in a dashed box B in FIG. 7C in accordance with some embodiments.

FIGS. 7A-7C are schematic cross-sectional views of structures produced at various stages of a manufacturing method of a semiconductor package and FIG. 8 is a schematic and enlarged view of the structure outlined in a dashed box B in FIG. 7C, in accordance with some embodiments. Unless specified otherwise, the materials and the formation methods of the elements in these embodiments are essentially the same as the like elements, which are denoted by like reference numerals in the embodiments shown in FIGS. 2A-2N.

Referring to FIG. 7A and with reference to FIGS. 2A-2B, the sacrificial connectors 60' and the conductive pillars 1101 may be formed over the first temporary carrier 50A. The sacrificial connectors 60' are similar to the sacrificial connectors 60 in FIG. 2A, except that in this embodiment, the cap portions 64 are omitted, if the subsequently mounted component (e.g., the local interconnect component 220A in FIG. 6) is provided with the cap portions. The sacrificial connectors 60' may be conductive pillars without caps. The height 60H' of the sacrificial connector 60' may range from about 2 μm to about 50 μm. In some embodiments, the height 60H' is about 8 μm.

Referring to FIG. 7B and with reference to FIG. 6, the local interconnect components 220A may be bonded to the sacrificial connectors 60'. For example, the local interconnect components 220A are picked and placed on the sacrificial connectors 60', where the cap portions 128 of the local interconnect components 220A may be in direct contact with the sacrificial connectors 60'. A reflow process may be performed on the cap portions 128 to form sacrificial joints 642' coupling the second conductive connectors 126 of the local interconnect components 220A to the sacrificial connectors 60'. Next, the underfill material 1091 may be formed over the first temporary carrier 50A and in a gap between the respective local interconnect component 220A and the first temporary carrier 50A. The underfill material 1091 may surround the sacrificial joints 642', the sacrificial connectors 60, and the second conductive connectors 126 for reducing stress and protection.

With continued reference to FIG. 7B and also referring to FIG. 2C, the step of forming the underfill material 1091 are similar in FIGS. 7B and 2C, except that the underfill material 1091 in FIG. 7B may be in direct contact with the second surface 121b of the semiconductor substrate 121 and the sidewalls of the second conductive connectors 126. The underfill material 1091 may extend along the sidewall 220s of the local interconnect component 220A. For example, the underfill material 1091 partially (or fully) covers the outer sidewall of the semiconductor substrate 121. Depending on the amount of the underfill material 1091, the underfill material 1091 may further extend to cover the outer sidewall(s) of the interconnect structure 122 (and the first insulating material layer 1251, in some embodiments).

The structure shown in FIG. 7B may undergo subsequent processing as described in the previous embodiments in FIGS. 2D-2N to achieve the final structure shown in FIG. 7C. Referring to FIG. 7C and the enlarged view in FIG. 8 and also with referring to FIGS. 2N and 5, a semiconductor package 20 is similar to the semiconductor package 20 described in FIG. 2N, except that the local interconnect component 120 in FIG. 2N is replace with the local interconnect component 220. The local interconnect components 220 may provide electrical routing and connection between the IC dies 312 and 314 of the IC package component 300. The local interconnect component 220 includes the TSVs 123 that extend through the semiconductor substrate 121 to be vertical and electrical path to the conductive connectors formed at two opposing sides of the semiconductor substrate 121. As shown in FIG. 8, the underfill layer 109 may be in direct contact with the first surface 1502a of the dielectric layer 1502 of the second redistribution structure 150, and the underfill layer 309 may be in direct contact with the second surface 1502b of the dielectric layer 1502 that is opposite to the first surface 1502a. The underfill layer 109 may also be in direct contact with the second surface 121b of the semiconductor substrate 121 and laterally surround the second conductive connectors 126.

In accordance with some embodiments, a semiconductor structure includes a substrate component, an IC die component disposed over the substrate component, and a composite redistribution structure interposed between and electrically coupled to the substrate component and the IC die component. The composite redistribution structure includes a first redistribution structure overlying the substrate component, a second redistribution structure underlying the IC die component, a local interconnect component disposed between the first and second redistribution structures, and an insulating encapsulation interposed between the first and second redistribution structures and embedding the local interconnect component therein. The local interconnect component includes TSVs penetrating through a semiconductor substrate, first conductive connectors interposed between the first redistribution structure and a first side of the semiconductor substrate, second conductive connectors interposed between the second redistribution structure and a second side of the semiconductor substrate which is opposite to the first side, and a first insulating layer interposed between the first redistribution structure and the first side of the semiconductor substrate and laterally covering the first conductive connectors. The TSVs are electrically coupled to the first and second conductive connectors.

In accordance with some embodiments, a semiconductor structure includes a local interconnect component including TSVs penetrating through a semiconductor substrate, first and second conductive connectors respectively disposed on a bottom surface and a top surface of the semiconductor substrate and electrically coupled to the TSVs, and a first insulating layer laterally covering the first conductive connectors. The semiconductor structure includes an underfill layer laterally covering the local interconnect component, an insulating encapsulation laterally covering the underfill layer and the local interconnect component, a first redistribution structure underlying the bottom surface of the insulating encapsulation, a second redistribution structure overlying the top surface of the insulating encapsulation, TIVs penetrating through the insulating encapsulation and electrically coupled to the first redistribution structure and the second redistribution structure, and at least two IC dies disposed over the second redistribution structure. The top and bottom surfaces of the semiconductor substrate are between a top surface and a bottom surface of the insulating encapsulation, and the at least two IC dies are interconnected at least through the second redistribution structure and the local interconnect component.

In accordance with some embodiments, a forming method of a semiconductor structure includes at least the following steps. A local interconnect component is bonded to sacrificial connectors, wherein the local interconnect component includes TSVs penetrating through a semiconductor substrate, first and second conductive connectors respectively disposed on a first surface and a second surface of the semiconductor substrate that are opposite to each other, where the second conductive connectors are bonded to the sacrificial connectors through sacrificial joints, and the first conductive connectors are covered by a first insulating layer on the first surface of the semiconductor substrate. An underfill material is formed to cover the local interconnect component, the sacrificial connectors, and the sacrificial joints. An encapsulating layer is formed to cover the local interconnect component and the underfill material. A first redistribution structure is formed on the encapsulating layer and the first conductive connectors of the local interconnect component. The sacrificial connectors, the sacrificial joints, and a portion of the underfill material which laterally covers the sacrificial connectors and the sacrificial joints are removed to accessibly expose the second conductive connectors after forming the first redistribution structure. A second redistribution structure is formed on the encapsulating layer and the second conductive connectors of the local interconnect component after the removing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate component;
   an integrated circuit (IC) die component disposed over the substrate component; and
   a composite redistribution structure interposed between and electrically coupled to the substrate component and the IC die component, the composite redistribution structure comprising:
      a first redistribution structure overlying the substrate component;
      a second redistribution structure underlying the IC die component;
      a local interconnect component disposed between the first and second redistribution structures, the local interconnect component comprising:
         through substrate vias (TSVs) penetrating through a semiconductor substrate;
         first conductive connectors interposed between the first redistribution structure and a first side of the semiconductor substrate;
         second conductive connectors interposed between the second redistribution structure and a second side of the semiconductor substrate which is opposite to the first side, and the TSVs being electrically coupled to the first and second conductive connectors; and
         a first insulating layer interposed between the first redistribution structure and the first side of the semiconductor substrate and laterally covering the first conductive connectors; and
      an insulating encapsulation interposed between the first and second redistribution structures and embedding the local interconnect component therein.

2. The semiconductor structure of claim 1, wherein lower surfaces of the first conductive connectors are substantially leveled with a lower surface of the insulating encapsulation, and upper surfaces of the second conductive connectors are substantially leveled with an upper surface of the insulating encapsulation.

3. The semiconductor structure of claim 1, wherein the local interconnect component further comprises:
   a second insulating layer interposed between the second redistribution structure and the second side of the semiconductor substrate and laterally covering the second conductive connectors.

4. The semiconductor structure of claim 3, wherein the composite redistribution structure further comprises:
   an underfill layer laterally covering at least the second insulating layer, wherein the insulating encapsulation laterally covers the underfill layer and a portion of the local interconnect component which is unmasked by the underfill layer.

5. The semiconductor structure of claim 1, wherein the first insulating layer comprises molding compound.

6. The semiconductor structure of claim 1, wherein the composite redistribution structure further comprises:
   a first underfill layer interposed between the second redistribution structure and the second side of the semiconductor substrate and laterally covering the second conductive connectors.

7. The semiconductor structure of claim 6, further comprising:
   a second underfill layer disposed on the second redistribution structure to cover the IC die component, wherein a cross-sectional profile of the first underfill layer and a cross-sectional profile of the second underfill layer are tapered in opposing directions.

8. The semiconductor structure of claim 1, wherein the local interconnect component further comprises:
   an interconnect structure disposed on the first side of the semiconductor substrate and electrically coupled to the second conductive connectors through the TSVs, wherein the first conductive connectors underlying the interconnect structure, and the TSVs penetrates through the interconnect structure to be connected to the first conductive connectors.

9. The semiconductor structure of claim 1, wherein a first interface between the local interconnect component and the first redistribution structure and a second interface between the local interconnect component and the second redistribution structure are solder-free.

10. The semiconductor structure of claim 1, wherein the first redistribution structure is coupled to the substrate component using first solder connections, and the second redistribution structure is coupled to the IC die component using second solder connections.

11. A semiconductor structure, comprising:
a local interconnect component comprising:
through substrate vias (TSVs) penetrating through a semiconductor substrate;
first and second conductive connectors respectively disposed on a bottom surface and a top surface of the semiconductor substrate and electrically coupled to the TSVs; and
a first insulating layer laterally covering the first conductive connectors;
an underfill layer laterally covering the local interconnect component;
an insulating encapsulation laterally covering the underfill layer and the local interconnect component, wherein the top and bottom surfaces of the semiconductor substrate are between a top surface and a bottom surface of the insulating encapsulation;
a first redistribution structure underlying the bottom surface of the insulating encapsulation;
a second redistribution structure overlying the top surface of the insulating encapsulation;
through insulating encapsulation vias (TIEVs) penetrating through the insulating encapsulation and electrically coupled to the first redistribution structure and the second redistribution structure; and
at least two integrated circuit (IC) dies disposed over the second redistribution structure, and the at least two IC dies being interconnected at least through the second redistribution structure and the local interconnect component.

12. The semiconductor structure of claim 11, further comprising:
a substrate component comprising a core layer, a third redistribution structure interposed between the core layer and the first redistribution structure, a fourth redistribution structure underlying the core layer, and through core vias penetrating through the core layer and electrically coupled to the third and fourth redistribution structures.

13. The semiconductor structure of claim 12, further comprising:
a protective layer underlying the first redistribution structure and laterally covering the substrate component, wherein a sidewall of the protective layer is substantially leveled with sidewalls of the first redistribution structure, the insulating encapsulation, and the second redistribution structure.

14. The semiconductor structure of claim 11, wherein the local interconnect component further comprises:
a second insulating layer laterally covering the second conductive connectors and interposed between the second redistribution structure and the top surface of the semiconductor substrate, wherein the second insulating layer spatially separates the second conductive connectors and the underfill layer.

15. The semiconductor structure of claim 11, wherein top surfaces of the second conductive connectors of the local interconnect component are substantially leveled with the top surface of the insulating encapsulation.

16. The semiconductor structure of claim 11, wherein bottom surfaces of the first conductive connectors and the first insulating layer of the local interconnect component are substantially leveled with the bottom surface of the insulating encapsulation.

17. A semiconductor structure, comprising:
a composite redistribution structure comprising:
a first redistribution structure disposed at a first side of the composite redistribution structure;
a second redistribution structure disposed at a second side of the composite redistribution structure opposite to the first side;
a local interconnect component interposed between the first and second redistribution structures, the local interconnect component comprising:
a semiconductor substrate comprising a first side facing the first redistribution structure and a second side opposite to the first side and facing the second redistribution structure;
a through substrate via (TSV) penetrating through the semiconductor substrate;
a first conductive connector disposed at the first side of the semiconductor substrate and connected to the TSV;
a second conductive connector disposed at the second side of the semiconductor substrate and connected to the TSV; and
a first insulating layer interposed between the first redistribution structure and the first side of the semiconductor substrate and laterally covering the first conductive connector;
a second insulating layer interposed between the second redistribution structure and the second side of the semiconductor substrate and laterally covering the second conductive connector, wherein the first insulating layer is more rigid than the second insulating layer.

18. The semiconductor structure of claim 17, wherein surfaces of the first conductive connector and the first insulating layer are connected to the first redistribution structure and substantially coplanar.

19. The semiconductor structure of claim 17, wherein surfaces of the second conductive connector and the second insulating layer are connected to the second redistribution structure and substantially coplanar.

20. The semiconductor structure of claim 17, wherein the first insulating layer comprises fillers and the second insulating layer is a filler-free layer.

* * * * *